US012561139B2

(12) United States Patent
Nield et al.

(10) Patent No.: US 12,561,139 B2
(45) Date of Patent: *Feb. 24, 2026

(54) ENCODING AND DECODING VARIABLE LENGTH INSTRUCTIONS

(71) Applicant: Imagination Technologies Limited, Kings Langley (GB)

(72) Inventors: Simon Thomas Nield, Hertfordshire (GB); James McCarthy, Hertfordshire (GB)

(73) Assignee: Imagination Technologies Limited, Kings Langley (GB)

( * ) Notice: Subject to any disclaimer, the term of this patent is extended or adjusted under 35 U.S.C. 154(b) by 6 days.

This patent is subject to a terminal disclaimer.

(21) Appl. No.: 18/406,527

(22) Filed: Jan. 8, 2024

(65) Prior Publication Data

US 2025/0224958 A1 Jul. 10, 2025

Related U.S. Application Data

(63) Continuation of application No. 17/737,537, filed on May 5, 2022, now Pat. No. 11,868,775, which is a (Continued)

(30) Foreign Application Priority Data

Nov. 23, 2016 (GB) ...................................... 1619781

(51) Int. Cl.
*G06F 9/30* (2018.01)
*G06F 8/41* (2018.01)
(Continued)

(52) U.S. Cl.
CPC .......... *G06F 9/30149* (2013.01); *G06F 8/443* (2013.01); *G06F 9/30152* (2013.01);
(Continued)

(58) Field of Classification Search
CPC .................................................. G06F 9/30149
See application file for complete search history.

(56) References Cited

U.S. PATENT DOCUMENTS 5,809,272 A 9/1998 Thusoo et al.
5,926,644 A 7/1999 Hays
(Continued)

FOREIGN PATENT DOCUMENTS

CN 103119849 A 5/2013
CN 102017634 A 4/2014
(Continued)

*Primary Examiner* — Michael J Metzger
(74) *Attorney, Agent, or Firm* — Potomac Law Group, PLLC; Vincent M DeLuca

(57) ABSTRACT

Methods of encoding and decoding are described which use a variable number of instruction words to encode instructions from an instruction set, such that different instructions within the instruction set may be encoded using different numbers of instruction words. To encode an instruction, the bits within the instruction are re-ordered and formed into instruction words based upon their variance as determined using empirical or simulation data. The bits in the instruction words are compared to corresponding predicted values and some or all of the instruction words that match the predicted values are omitted from the encoded instruction.

15 Claims, 12 Drawing Sheets

Related U.S. Application Data continuation of application No. 16/789,366, filed on Feb. 12, 2020, now Pat. No. 11,347,509, which is a continuation of application No. 15/821,930, filed on Nov. 24, 2017, now Pat. No. 10,579,381.

(51) Int. Cl.

| | | |
|---|---|---|
| *G06F 9/38* | (2018.01) | |
| *H03M 7/00* | (2006.01) | |
| *H03M 7/30* | (2006.01) | |

(52) U.S. Cl.

CPC ........ *G06F 9/30156* (2013.01); *G06F 9/3016* (2013.01); *G06F 9/30163* (2013.01); *G06F 9/30178* (2013.01); *G06F 9/3802* (2013.01); *G06F 9/382* (2013.01); *G06F 9/3856* (2023.08); *H03M 7/00* (2013.01); *H03M 7/702* (2013.01)

(56) References Cited

U.S. PATENT DOCUMENTS

| | | | |
|---|---|---|---|
| 7,774,748 | B1 | 8/2010 | Goodwin |
| 2004/0015931 | A1 | 1/2004 | Larin et al. |
| 2004/0024990 | A1 | 2/2004 | Chauvel et al. |
| 2005/0033946 | A1* | 2/2005 | Abadallah ............. G06F 9/3842 |
| | | | 712/E9.05 |
| 2005/0278508 | A1 | 12/2005 | Vasekin et al. |
| 2008/0155353 | A1 | 6/2008 | Craske |
| 2008/0244506 | A1 | 10/2008 | Killian et al. |
| 2011/0026545 | A1 | 2/2011 | Kim et al. |
| 2012/0110307 | A1 | 5/2012 | Tsuji |
| 2012/0155570 | A1 | 6/2012 | Ginzburg et al. |
| 2012/0226891 | A1* | 9/2012 | Estlick ................. G06F 9/3842 |
| | | | 712/23 |
| 2012/0284461 | A1 | 11/2012 | Larin et al. |
| 2014/0082334 | A1 | 3/2014 | King et al. |

FOREIGN PATENT DOCUMENTS

| | | |
|---|---|---|
| CN | 104011670 A | 8/2014 |
| CN | 104778030 A | 7/2015 |
| CN | 105808209 A | 7/2016 |
| EP | 0689128 A1 | 12/1995 |
| WO | 98/38791 A2 | 9/1998 |
| WO | 00/38082 A1 | 6/2000 |
| WO | 2008/118791 A1 | 10/2008 |

* cited by examiner

FETCH N END BITS
602A

ANALYSE END BITS
TO DETERMINE F
602B

FETCH F
INSTRUCTION
WORDS
602C

FETCH ONE OR MORE INSTRUCTION WORDS ⁓602

DETERMINE ENCODING TYPE ⁓604

SELECT FETCHED INSTRUCTION WORD OR PREDICTED WORD ⁓610

RE-ORDER BITS USING MAPPING FOR ENCODING TYPE ⁓612

OUTPUT DECODED INSTRUCTION ⁓614

ENCODING AND DECODING VARIABLE LENGTH INSTRUCTIONS

CROSS-REFERENCE TO RELATED APPLICATIONS AND CLAIM OF PRIORITY

This application is a continuation under 35 U.S.C. 120 of application Ser. No. 17/737,537 filed May 5, 2022, now U.S. Pat. No. 11,868,775, which is a continuation of prior application Ser. No. 16/789,366 filed Feb. 12, 2020, now U.S. Pat. No. 11,347,509, which is a continuation of prior application Ser. No. 15/821,930 filed Nov. 24, 2017, now U.S. Pat. No. 10,579,381, which claims foreign priority under 35 U.S.C. 119 from United Kingdom Application No. 1619781.6 filed Nov. 23, 2016, the contents of which are incorporated herein by reference in their entirety.

BACKGROUND

The set of instructions which are executed by a processor are referred to as an instruction set and these instructions are typically mapped to instruction words as a way of presenting the hardware controls to the software. The processes of mapping instructions to instruction words and back may be referred to as encoding and decoding respectively. Code density may be used to compare different encoding schemes, where the code density is inversely proportional to the memory required to store all the encoded instructions (i.e. instruction words) used to perform a particular task (e.g. all the encoded instructions in a particular program). To increase the code density, short instruction words may be used and this may, for example, be achieved by limiting the functionality of the instruction set. Alternatively, variable length instruction words may be used, with shorter instruction words being used for more commonly used instructions and longer instruction words being used for less commonly used instructions.

The embodiments described below are provided by way of example only and are not limiting of implementations which solve any or all of the disadvantages of known methods of encoding and decoding instructions from an instruction set.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Methods of encoding and decoding are described which use a variable number of instruction words to encode instructions from an instruction set, such that different instructions within the instruction set may be encoded using different numbers of instruction words. To encode an instruction, the bits within the instruction are re-ordered and formed into instruction words based upon their variance as determined using empirical or simulation data. The bits in the instruction words are compared to corresponding predicted values and some or all of the instruction words that match the predicted values are omitted from the encoded instruction.

A first aspect provides a method of encoding instructions from an instruction set, the method comprising: receiving an instruction from the instruction set; re-ordering and grouping bits in the received instruction into a plurality of instruction words according to an encoding type to generate an ordered sequence of instruction words; comparing bit values in one or more of the instruction words in the ordered sequence to their corresponding predicted values and generating a compressed version of the instruction by omitting one or more of the instruction words in the ordered sequence based on the comparison, wherein the predicted values are generated using empirical and/or simulation data; and outputting the compressed version of the instruction.

A second aspect provides a device for encoding instructions from an instruction set, the device comprising: a processor; and a memory arranged to store device-executable instructions configured, when executed by the processor, to cause the processor, in response to receiving an instruction from an instruction set, to: re-order and group bits in the received instruction into a plurality of instruction words according to an encoding type to generate an ordered sequence of instruction words; compare bit values in one or more of the instruction words in the ordered sequence to their corresponding predicted values, wherein the predicted values are generated using empirical and/or simulation data; generate a compressed version of the instruction by omitting one or more of the instruction words in the ordered sequence based on the comparison between the bit values in one or more of the instruction words in the ordered sequence and their corresponding predicted values; and output the compressed version of the instruction.

A third aspect provides a method of decoding instructions comprising: receiving, in a decode stage of a processor, one or more fetched instruction words; determining an encoding type from one or more of the fetched instruction words; generating an ordered sequence of instruction words by selecting, for each of the instruction words in the sequence, either a fetched instruction word or a predicted instruction word, wherein the predicted instruction words are generated using empirical and/or simulation data; concatenating the instruction words in the ordered sequence to form an encoded instruction and re-ordering bits in the encoded instruction according to the encoding type to generate a decoded instruction; and outputting the decoded instruction.

A fourth aspect provides decoding hardware comprising: an input arranged to receive one or more fetched instruction words; hardware logic configured to determine an encoding type from one or more of the fetched instruction words; word selection logic configured to generate an ordered sequence of instruction words by selecting, for each of the instruction words in the sequence, either a fetched instruction word or a predicted instruction word, wherein the predicted instruction words are generated using empirical and/or simulation data, and to concatenate the instruction words in the ordered sequence to form an encoded instruction; re-order hardware logic configured to re-order bits in the encoded instruction according to the encoding type to generate a decoded instruction; and an output arranged to output the decoded instruction.

A fifth aspect provides a device for decoding instructions from an instruction set, the device comprising: a processor; and a memory arranged to store device-executable instructions configured, when executed by the processor, to cause the processor, in response to receiving one or more fetched instruction words, to: determine an encoding type from one or more of the fetched instruction words; generate an ordered sequence of instruction words by selecting, for each of the instruction words in the sequence, either a fetched instruction word or a predicted instruction word, wherein the predicted instruction words are generated using empirical and/or simulation data; concatenate the instruction words in the ordered sequence to form an encoded instruction and re-ordering bits in the encoded instruction according to the encoding type to generate a decoded instruction; and output the decoded instruction.

A sixth aspect provides a method comprising: receiving, at an input, mapping data for an instruction set and instruction data describing instructions in an instruction set in canonical form; parsing the mapping data and instruction data using a grammar library; generating, in a code and data generation engine, both encoding software and a hardware description of a decoder based on the parsed mapping data and instruction data; and outputting the encoding software and the hardware description of a decoder.

A seventh aspect provides a device comprising: a processor; and a memory arranged to store device-executable instructions configured, when executed by the processor, to cause the processor, in response to receiving mapping data for an instruction set and instruction data describing instructions in an instruction set in canonical form, to: parse the mapping data and instruction data using a grammar library; generate both encoding software and a hardware description of a decoder based on the parsed mapping data and instruction data; and output the encoding software and the hardware description of a decoder.

The decoding and/or encoding apparatus described herein may be embodied in hardware on an integrated circuit. There may be provided a method of manufacturing, at an integrated circuit manufacturing system, a decoding and/or encoding apparatus. There may be provided an integrated circuit definition dataset that, when processed in an integrated circuit manufacturing system, configures the system to manufacture a decoding and/or encoding apparatus. There may be provided a non-transitory computer readable storage medium having stored thereon a computer readable description of an integrated circuit that, when processed, causes a layout processing system to generate a circuit layout description used in an integrated circuit manufacturing system to manufacture an encoding and/or decoding apparatus.

There may be provided an integrated circuit manufacturing system comprising: a non-transitory computer readable storage medium having stored thereon a computer readable integrated circuit description that describes the decoding and/or encoding apparatus; a layout processing system configured to process the integrated circuit description so as to generate a circuit layout description of an integrated circuit embodying the decoding and/or encoding apparatus; and an integrated circuit generation system configured to manufacture the decoding and/or encoding apparatus according to the circuit layout description.

There may be provided computer program code for performing a method as described herein. There may be provided non-transitory computer readable storage medium having stored thereon computer readable instructions that, when executed at a computer system, cause the computer system to perform the method as described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which.

Figure 1:
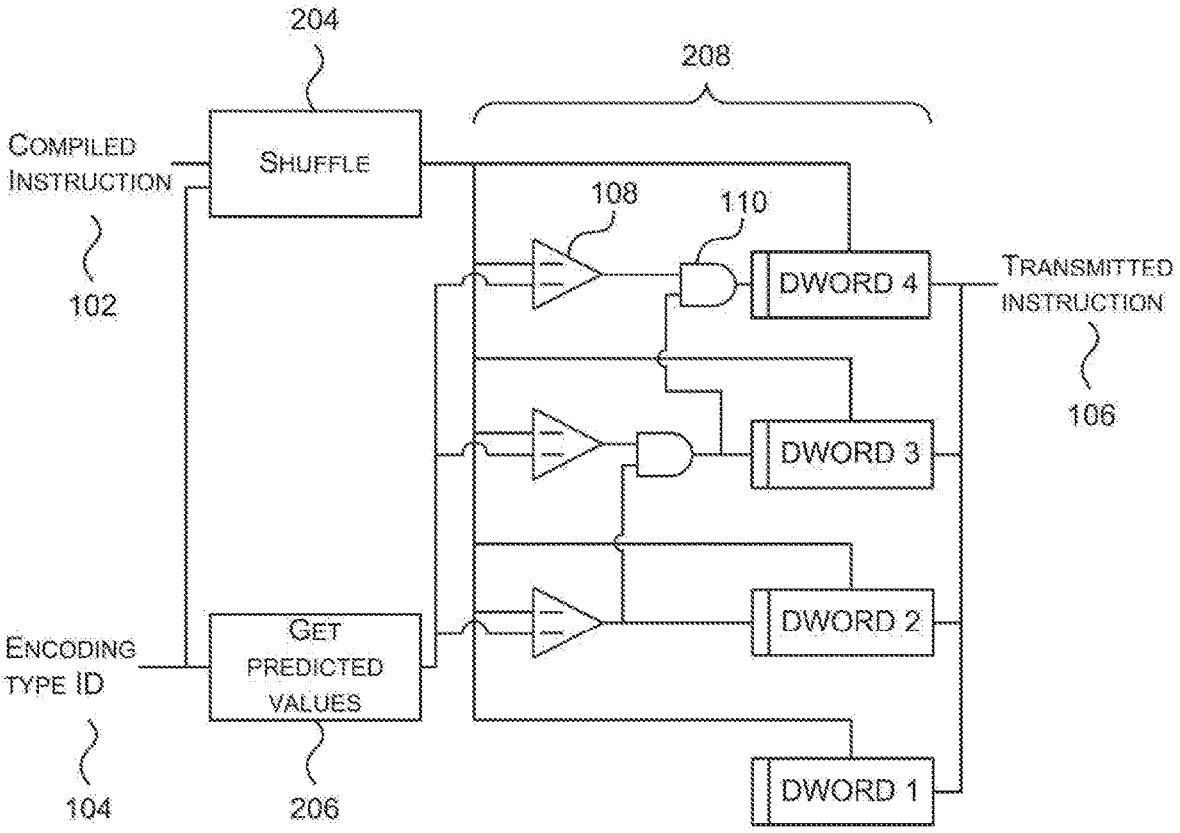
FIG. 1 is a schematic diagram showing an example encoding method.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art.

Embodiments will now be described by way of example only.

As described above, instructions are typically mapped to instruction words. By using shorter instruction words, the code density (and hence the memory bandwidth for loading the instructions and memory size to store the instructions) is reduced; however, this may limit the possible functionality of the instruction set and so the encoding software and decoding hardware may need to be able to switch between two modes: a first mode which uses standard length instruction words and a second mode which uses reduced length instruction words, and a special instruction is required to trigger the switching between modes. Alternatively, variable length instruction words may be used, with instructions that are more frequently used being mapped to the shorter instruction words and instructions that are less frequently used being mapped to the longer instruction words. However, in such examples the decoding hardware must be designed to work with instructions with the variable lengths of instruction words that are used and this increases the complexity of the hardware (e.g. in a similar manner to the switching between modes described above). Additionally it is typically complex to add a new instruction to an instruction set which uses variable length instruction words and the process is prone to errors. The new instruction may be implemented by adding a new field to the end of the existing instruction word format; however, this means that the new instruction word will be long (thereby reducing overall code density, and hence efficiency, of a program comprising the new instruction) and requires changes to the encoding and decoding software and hardware (which is complex, costly and error-prone). The addition of a new instruction may also result in branching instruction encodings where a particular feature in the hardware is not available in all encodings.

Described herein are methods of encoding and decoding that use variable length instruction encoding. Unlike the methods described above, the methods described herein do not use encodings in which each instruction in an instruction set is mapped to a different single instruction word of variable length (such that different instructions within the set are mapped to different instruction words having different lengths). Instead the methods described herein map the instructions in an instruction set to a variable number of instruction words (e.g. between 1 and N instruction words, where N is an integer) and where the length of an instruction word may be fixed or may be a multiple of a fixed length (e.g. such that instruction words comprise $aL$ bits where L is fixed and a is an integer and may vary between instruction words), with different instructions within an instruction set being encoded using different numbers of instruction words. The length of the instruction words that are used (e.g. the length of all the words where the length is fixed or the value of L, which may be referred to as the 'unit length') may be set dependent upon the characteristics of a particular memory system (or sub-system). The methods described herein may also accommodate multiple different mappings (e.g. for different types of ALUs, different shaders, different processors or variants of processors, etc.).

As described in more detail below, to encode an instruction from an instruction set, the bits within an instruction (in canonical form) are re-arranged (or shuffled) and formed into a plurality of instruction words (e.g. N instruction words, where the value of N may be the same for all instruction sets or may be different for different instruction sets or may be different for different instructions within the same instruction set) according to an encoding (or mapping) type, where these instruction words may be of a fixed length or may have a length which is a multiple of a fixed unit length. The plurality of instruction words comprise an ordered sequence of instruction words and in various examples, each instruction (or each instruction of a particular instruction type) may be divided into the same number of instruction words. This ordered of sequence of instruction words is then reduced in length by removing one or more instruction words that only comprise bits that have values which match predicted values (which may alternatively be referred to as expected or default values) for those bits and the shortened sequence, comprising M instruction words (where M is an integer and $1 \le M \le N$) is output. The mappings and the predicted values may be generated based on empirical data and/or simulation data (as described in more detail below).

In various examples, the shortening of the sequence of instruction words may be performed by truncating the sequence to remove one or more (e.g. any) instruction words at the end of the sequence that only comprise bits that have values which match the predicted values. When performing the truncation, bits in the instruction are compared to the predicted values for the bits. The encoded form of an instruction may therefore comprise the first M instruction words which do not comprise only bits which are the same as the predicted values. Any of the first M words may comprise some bits that are the same as the predicted values as long as there is at least one subsequent bit in the same instruction word or a later instruction word in the sequence that is different from the predicted value.

In other examples, the shortening of the sequence of instruction words may be performed using a mask to discard one or more instruction words throughout the ordered sequence of instruction words (i.e. not necessarily from the end of the sequence as is the case when using truncation). In various examples an N-bit mask may be used (i.e. one bit for each of the instruction words in the sequence of instruction words), with each bit in the mask describing whether the corresponding instruction word in the sequence should be encoded or have the predicted value (and hence be removed from the sequence), e.g. if N=4 and the mask is 0101 (with the LSB to the right), the shortening of the sequence of instruction words retains the first and third instruction words (as indicated by the '1's in the mask) and removes the second and fourth instruction words (as indicated by the '0's in the mask). The mask may be generated as part of the encoding process, for example by comparing bits in the instruction to the predicted values for the bits.

The encoding method may be used to encode compiled instructions, e.g. at the end of the compilation process (which may be referred to as deferred encoding) or later. If the encoding is performed subsequent to compilation, the same program binary may be used for different processor hardware (e.g. different types of processor or different variants of the same processor) by using a different encoding type when performing the encoding. This may, for example, enable execution of the same compiled binary file on a number of processor variants by translating to the native encoding of each variant at run-time, i.e. when loading an application (or other program) from host memory into processor (e.g. GPU) memory (i.e. before the program is first used by the GPU or other processor). This reduces the overall size of the delivered binary for multi-platform applications.

As described in more detail below, to decode an instruction, a plurality of instruction words (e.g. F instruction words) are fetched and then based on an encoding (or mapping) type, which may be determined from the fetched instruction words, an ordered sequence of at least N instruction words (where N may be fixed or may be different for different instruction sets or different instructions within the same instruction set) is generated by selecting, for each word in the ordered sequence, either a fetched instruction word or a predicted instruction word. When generating the sequence, some of the later instruction words that have been fetched may be discarded and replaced by predicted instruction words because, as described above, an instruction is encoded as M instruction words (where $1 \le M \le N$) and in examples where M<F, some of the F instruction words which are fetched will relate to the next instruction(s). In examples where the plurality of instruction words are fetched from higher levels of cache (e.g. main memory or an L3 cache), more than N instruction words and/or more than M instruction words may be fetched (such that F>N and/or F>M) with F being selected such that the fetch operation is an efficient operation within the cache hierarchy. In examples where the plurality of instruction words are instead fetched from lower levels of cache (i.e. levels of the cache closer to the processor e.g. an L1 or L2 cache), only the exact number of words that are required may be fetched (such that F=M), with this number of words (F) being determined based on bits (e.g. END bits) within the stored instruction words (as described in more detail below). The bits within the sequence of instruction words are then re-arranged (or de-shuffled) according to an encoding (or mapping) type (i.e. in a reverse of the process performed when performing the encoding) to generate a decoded instruction.

The decoding method may be implemented within a decode stage of a processor and may be implemented in hardware and/or software (e.g. microcode). The decoding method may also be implemented within a disassembler (which may be implemented in software).

Described herein is also a tool which automatically generates the hardware description (e.g. in VHDL, Verilog or other hardware description language) for a decoder that implements the decoding method described herein, software for use in implementing the encoding method described herein and/or software for use in implementing the decoding method described herein. The software tool may also automatically generate human-readable documentation detailing the mapping used to re-arrange the bits for a particular encoding (or mapping) type. By using the tool to generate these automatically (and in particular, to automatically generate both the encoding software and decoding hardware/software together), it reduces the possibility of errors being introduced in the hardware, software or human-readable document and hence improves the reliability of the encoding and decoding operations. Methods of generating and optimizing the mapping used are also described (which improves the efficiency of the encoding scheme) and this functionality may also be implemented within the tool.

Figure 2:
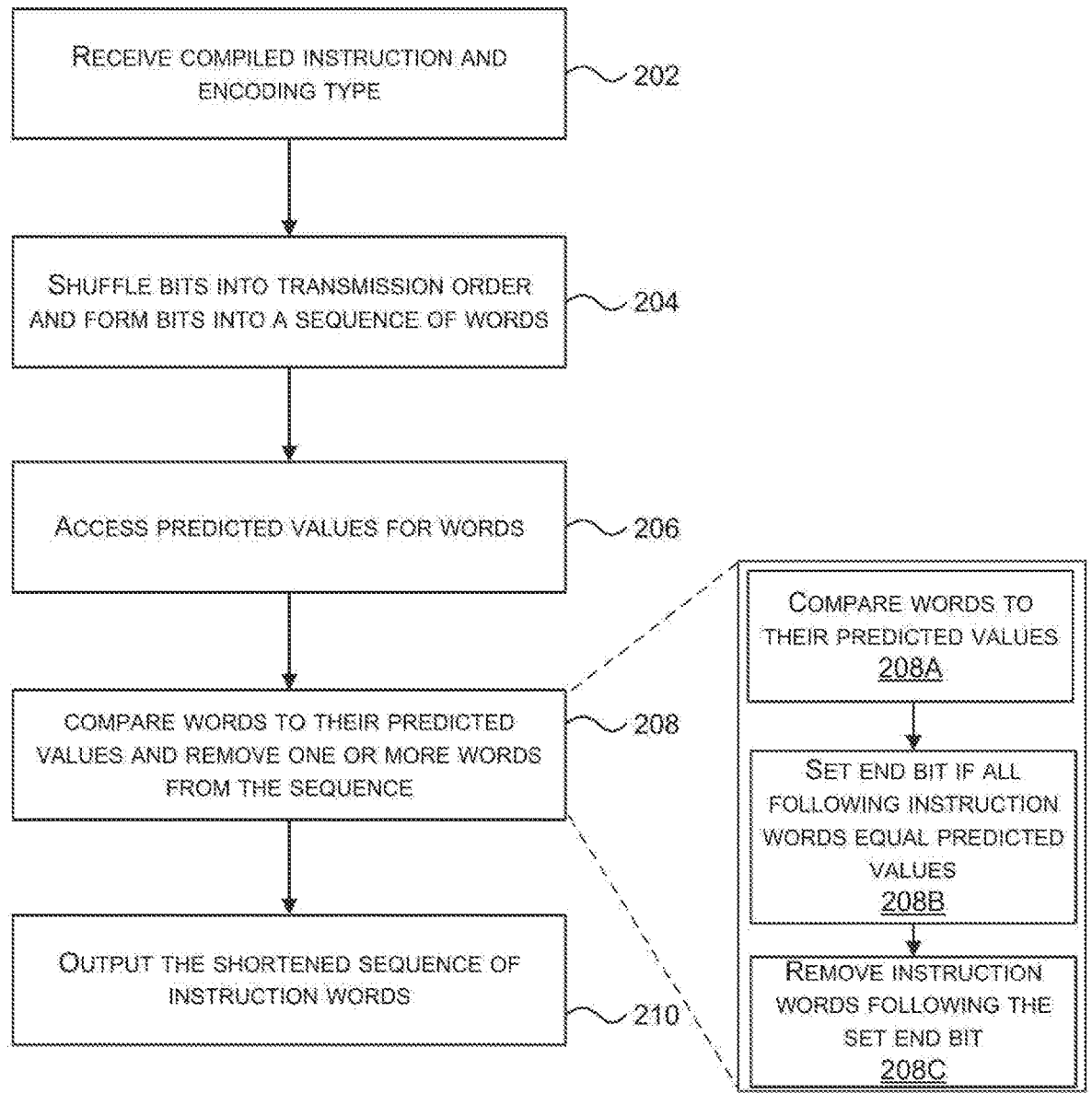
FIG. 2 is a flow diagram showing the encoding method from FIG. 1.

The method of encoding can be described with reference to FIGS. 1-4. FIG. 1 is a schematic diagram showing the encoding method which may be implemented in software (e.g. running on hardware such as a processor) and FIG. 2 is a flow diagram showing the encoding method. In examples where the encoding is performed at the end of the compilation process, the encoding method may be implemented within a compiler or assembler. In examples where the encoding is performed at run-time (as described above), the encoding method may be implemented on the processor running the operating system (e.g. which loads an application or other program from host memory into processor memory) or on another processor (e.g. a processor within the GPU which loads an application or other program from host memory into GPU memory). As shown in FIGS. 1 and 2, a compiled instruction 102 and an encoding (or mapping) type identifier 104 are received (block 202). The encoding type identifier 104 determines the mapping between bit positions in the compiled instruction 102 and the output (or transmitted) instruction 106 and this mapping may be stored in a look-up table or in any other manner. The encoding type identifier 104 also determines the predicted values for all of the bits and these predicted values may be stored in a look-up table or in any other manner. In various examples, the encoding type identifier 104 is used to perform a look-up function to access both the mapping (which is used in block 204) and the predicted values (which are accessed in block 206 and used in block 208). In other examples, the mapping and predicted values may be provided directly (in block 202) instead of, or in addition to, the encoding type identifier 104.

Different mappings (and optionally different predicted values) and hence different encoding type identifiers 104 may be used in many different circumstances. For example, different mappings may be used for instructions that are executed by different types of ALUs and/or by ALUs of the same type which are used differently (e.g. ALUs of the same type which are in different shaders within a GPU) and/or instructions that are executed using different hardware or different versions of the same hardware. As described in more detail below, the mappings may be determined based on usage analysis.

Having received the compiled instruction 102 (in block 202), the bits in the received instruction 102 are shuffled into their transmission order and grouped into a sequence of instruction words (block 204). The re-ordering of bits that is performed is based on the mapping for the particular encoding type (as identified by the encoding type identifier 104) and, as described above, this mapping may be stored in a look-up table and accessed using the received encoding type identifier 104. This shuffling of bits and formation of instruction words (in block 204) can be further described with reference to FIG. 3.

Figure 3:
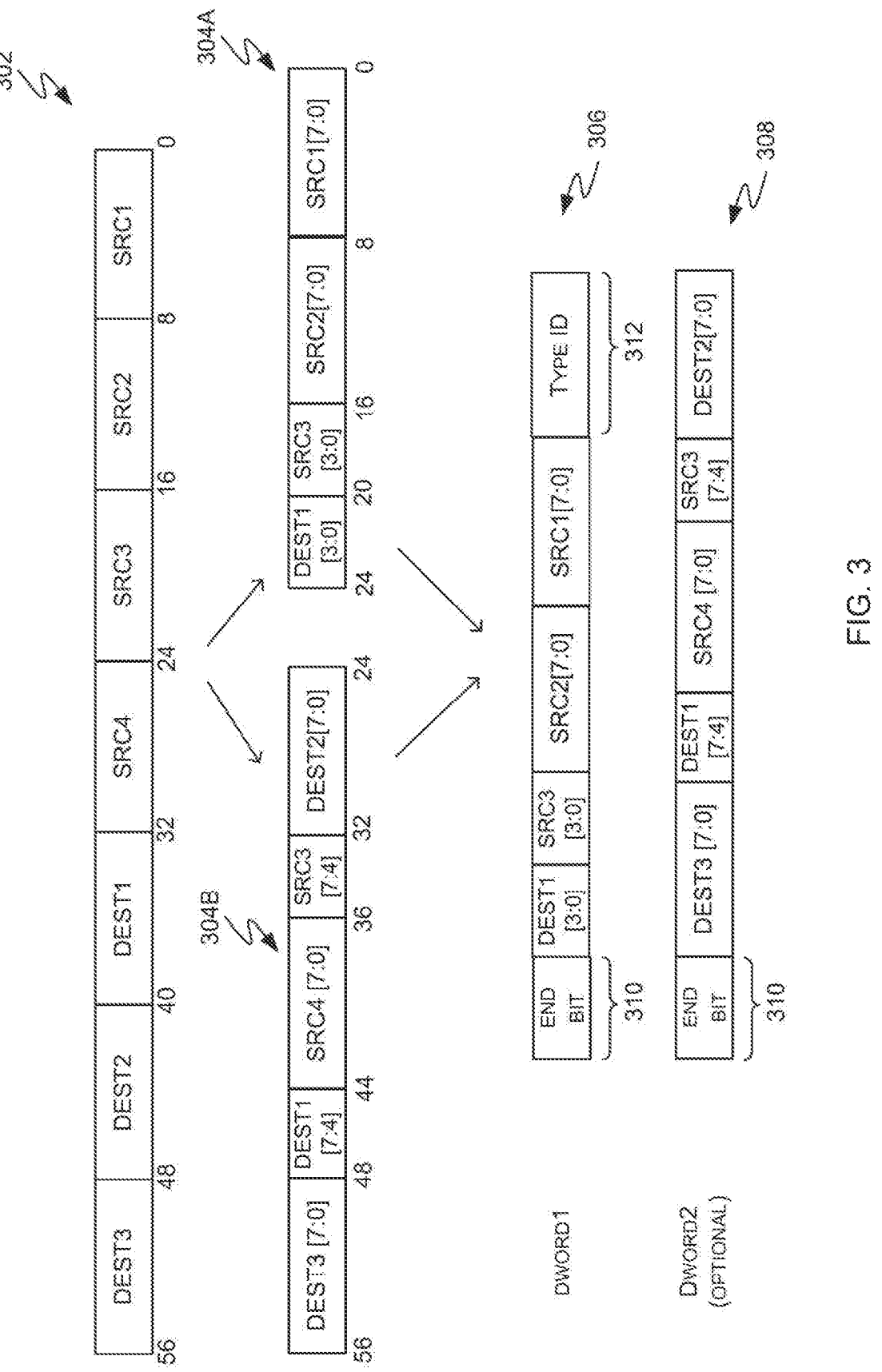
FIG. 3 is a graphical illustration of the encoding method shown in FIGS. 1 and 2.

FIG. 3 shows the payload of (i.e. the data relating to) an example instruction as received 302 which comprises four source fields (SRC1-4, each comprising 8 bits, labeled 0-7) and three destination fields (DEST1-3, each comprising 8 bits, labeled 0-7) and the same instruction payload after the bits have been shuffled and grouped into two instruction words 304A, 304B (in block 202). In the shuffle operation (in block 202), the bits within the received instruction are re-ordered and as shown in FIG. 3, this does not necessarily comprise re-ordering complete fields, although some fields may be re-positioned with all the bits staying contiguous (e.g. fields SRC1, SRC2, SRC4, DEST2 and DEST3 in the example shown). When performing the shuffling of bits (in block 202), bits from fields may be separated and re-ordered in any way and in various examples, the bits from a field may be separated so that they are no longer contiguous.

As described above, the mapping which is used to perform the shuffling operation (in block 202) specifies two positions for each bit in the instruction: the first position is the position of the bit in the received instruction 102, 302 and the second position is the instruction word into which the bit is placed (e.g. word 304A or 304B) and optionally the position within that word. Hence the mapping inherently specifies the value of N for the particular instruction (i.e. as a consequence of the number of instructions specified within the mapping) and the length of any particular instruction word (i.e. as a consequence of how many fields/bits are allocated to a particular instruction word). The mapping that is used is selected based on the encoding type identifier 104 (which in various examples may be implemented as the opcode of an instruction).

In addition to using the encoding type identifier 104 to determine the mapping that is used and hence how the bits are shuffled and grouped into instruction words (in block 204), the encoding type identifier 104 may also be used to access predicted words, i.e. predicted values for some or all of the bits in the instruction (block 206). In various examples, however, the predicted values for all the bits in the instruction may be the same for all instructions in the instruction set (or across all instruction sets) and all encoding type identifiers (e.g. the predicted values may be all ones or all zeros or any pre-defined pattern of ones and zeros) in which case there is no need to access predicted values (and block 206 may be omitted or optimized out during synthesis of the software). In other examples where the number of different (e.g. non-zero) bits is limited, block 206 may be partially optimized out during the synthesis of the software.

The mapping which is used to shuffle the order of the bits in the instruction 102 and form them into instruction words (in block 204) may be generated in a number of ways.

Empirical data can be generated by feeding typical content into a compiler and/or assembler capable of generating the target instruction set and analyzing the output. Alternatively a simulation could be performed on typical content which attempted to predict which features of the instruction set would be most commonly used. In both cases the result would be a table of all the instruction bits ordered by their frequency of use with the most frequently changing bits listed first. This then provides an initial ordering for the bits in an instruction. For example, there may be different mappings for the same ALU but for different uses, e.g. the same type of ALU may have a different mapping depending upon whether the ALU is part of a pixel shader, a vertex shader or a compute shader and/or based on the instruction type. Those bits which have a higher variance (e.g. those bits with an average value over all instances of the instruction which is closer to 0.5) are placed at (or towards) the start of the ordered sequence of instruction words (e.g. into the first word 304A) and those bits which have a lower variance (e.g. those bits with an average value over all instances of the instruction which is closer to either one or zero) or do not change at all (e.g. those bits with an average value over all instances of the instruction which is equal to either one or zero) are placed towards the end of the ordered sequence of instruction words (e.g. into the second word 304B).

In order to achieve compression (i.e. the reduction of the number of instruction words transmitted), the mapping may control which word any particular bit is shuffled and grouped into, with bits then being placed anywhere within a word. In some examples, however, the mapping may also control placement of bits within an instruction word, e.g. to save logic in the decoding hardware by reducing differences between instructions.

Referring to the example shown in FIG. 3, the usage analysis may identify that bits 0-3 of the SRC3 field toggle more frequently than the following four bits (bits 4-7) of the SRC3 field and hence bits 0-3 of the SRC3 field are placed towards the start of the ordered sequence of instruction words (e.g. into the first instruction word 304A) whilst bits 4-7 of the SRC3 field are placed later in the ordered sequence of instruction words (e.g. into the second instruction word 304B). The same may also be found for DEST1 (e.g. such that the first three bits of the field are placed into the first instruction word 304A and the last three bits of the field are placed into the second instruction word 304B). It may also be found that all the bits of SRC4 and DEST3 remain zero most of the time and so these fields are placed in their entirety towards the end of the ordered sequence of instruction words (e.g. into the second instruction word 304B).

As described above, the mapping that is used in the shuffle operation (in block 204) is identified based on the encoding type identifier 104 (received in block 202). The number of bits within an encoding type identifier 104 which are used to specify the encoding may be of a fixed length or a variable length. For example, if the encoding type identifier 104 comprises three bits, the encoding may be specified by one, two or three of those bits, as shown in the table below:

| Encoding type identifier (LSB to the right) | Encoding type | Number of bits used to specify encoding |
| --- | --- | --- |
| 000 | F16 instruction | 1 (first bit = 0) |
| 100 | F16 instruction | 1 (first bit = 0) |
| 010 | F16 instruction | 1 (first bit = 0) |

-continued

| Encoding type identifier (LSB to the right) | Encoding type | Number of bits used to specify encoding |
| --- | --- | --- |
| 110 | F16 instruction | 1 (first bit = 0) |
| 001 | F32 instruction | 3 |
| 101 | Integer instruction | 3 |
| 011 | Memory load/store | 2 (first two bits = 11) |
| 111 | Memory load/store | 2 (first two bits = 11) |

As part of the shuffle operation the bits in the instruction are formed into an ordered sequence of instruction words 304A, 304B (in block 204, e.g. into N words, where N is an integer which may be fixed or variable). Then the instruction words 304A, 304B are compared to their predicted values and one or more words that comprise only bits that have values that match the predicted values are removed from the sequence to generate a shortened ordered sequence comprising M words, where M is an integer and 1≤M≤N (block 208). Control bits 310, 312 may then be added to one or more of the words in the shortened sequence (e.g. in a header portion and/or a tail portion). The instruction in compressed form 106 which comprises the shortened ordered sequence of M words with any added control bits (e.g. DWORD1 306 and optionally DWORD 2 308) is then output (block 210).

In the example shown in FIG. 3, control bits may be added in the form of header and/or tail portions. In the example shown in FIG. 3, each instruction word 306, 308 comprises a tail portion 310 which comprises an end bit and the first instruction word 306 also comprises a header portion 312 which comprises the encoding type identifier 104 (referred to as the TYPE ID). In examples where the value of N is variable, the tail portion 310 or the header portion 312 may comprise one or more bits which specify the value of N (e.g. as part of the encoding type identifier 104).

As described above, the shortening of the sequence of instruction words (in block 208) is based on the comparison to the predicted words and may be performed by truncation (e.g. by removing those words at the end of the sequence that comprise only bits that have values that match the predicted values) or using a mask (e.g. by removing words that comprise only bits that have values that match the predicted values from any position in the sequence).

The output instruction words may be of a fixed (i.e. predefined) size or their size may be variable (e.g. length=aL, where a is a variable integer and L is a unit length) and one or more of the output instruction words may additionally comprise control bits (e.g. in the form of a header portion and/or a tail portion, as described above).

The predicted values of the bits used in the comparison (in block 208), which form the core of compression scheme, may be generated in a number of ways. Empirical data can be generated by feeding typical content into a compiler and/or assembler capable of generating the target instruction set and analyzing the output. Alternatively a simulation could be performed on typical content which attempted to predict which features of the instruction set would be most commonly used. In both cases the result would be a table of all the instruction bits ordered by their frequency of use with the most frequently changing bits listed first. This then provides the initial ordering for the words containing the predicted values; however, the final ordering may be a modified version of this initial ordering. The predicted values, like the mappings, may be determined at any level of granularity and multiple instructions within an instruction set may share the same mapping or predicted values (e.g.

there may be two instructions within an instruction set which use the same mapping but different predicted bits). The predicted values may then be set to the most likely value for each of the bits in the instruction (e.g. if a bit in the instruction has a value of one for more than 50% of the cases included in the usage analysis, the predicted value may be set to one and if a bit in the instruction has a value of zero for 50% or more of the cases included in the usage analysis, the predicted value may be set to zero). In various examples, instead of only considering one instruction at a time, the correlation of predicted bit values may also be considered, e.g. such that the predicted values used depend upon the values of other bits in the same instruction and/or the same bit in other instructions (e.g. the immediately previous instruction). In other examples the predicted values of all the bits may be fixed to the same value (e.g. a one or a zero), in which case it is not necessary to access the predicted values (and block 206 may be omitted or optimized out). In other examples, as described above, where the number of different (e.g. non-zero) bits is limited, block 206 may be partially optimized out during the synthesis of the software.

As shown in FIG. 1, in various examples comparisons are performed on a per-bit basis 108 (in block 208A) and then the results are combined 110 such that the end bit in the tail portion 310 of an output instruction word is set if all the subsequent instruction words comprise only bits that equal their predicted value (block 208B). Those subsequent instruction words (which comprise only bits that equal their predicted value) are then removed from the sequence of instruction words (block 208C), such that only the first M instruction words that are not the same as the predicted words are output (in block 210).

In other examples, where a mask is used, data identifying the mask, or the mask bits themselves, may be included within the header or tail portions of one or more output instruction words. For example, the first output word may contain (e.g. in the header/tail portion) a mask bit for the second word, the second output word may contain a mask bit for the third word, etc. The value of the mask bit in the first output word may have two possible values, one that indicates that the second word is present and the other that indicates that the second word is not present but the third word is present. Similarly, the value of the mask bit in a subsequent output word may have two possible values, one that indicates that the next word in the sequence is present and the other that indicates that the next word is not present but the word following the next word is present.

The comparison process can be further described with reference to the example shown in FIG. 4. In this example, the instruction 402 (which may be a compiled instruction) comprises 16 bits. The bits in the instruction 402 are shuffled and grouped (in block 204) according to the mapping for the appropriate encoding type (as identified based on the encoding type identifier 104 received in block 202) to form a plurality of instruction words 406.

Some or all of the instruction words 406 are then compared to the predicted values for the bits 408 (in block 208). It can be seen from the schematic diagram in FIG. 1, that as one instruction word (e.g. DWORD1) is always output (in block 210), the comparison between bits and their predicted values may be omitted for this first instruction word (as indicated by the dotted outline of the predicted values for the first word in FIG. 4) and this reduces the processing effort involved in the encoding operation. More generally, if a minimum of X instruction words are always used for an instruction (where X=1 in the example shown but in other examples X may be greater than one, such that X≤M≤N), the comparison may not be performed for the first X instruction words.

As described above, each transmitted instruction word may comprise one or more control bits, e.g. a header portion 414 and/or a tail portion 412. In various examples, the first instruction word comprises an encoding type identifier 414 which may be exactly the same as the received encoding type identifier 104 or may provide the same information in a different format. In various examples, each transmitted instruction word comprises one or more bits 412 (which may be referred to as an end bit) which indicate whether this is the last transmitted instruction word for an instruction. In the example shown in FIG. 4, all the bits in the second instruction word match the predicted values and so only the first instruction word is transmitted (and hence forms the transmitted instruction 410) and the end bit in the tail portion 412 of the first instruction word is set.

Figure 4:
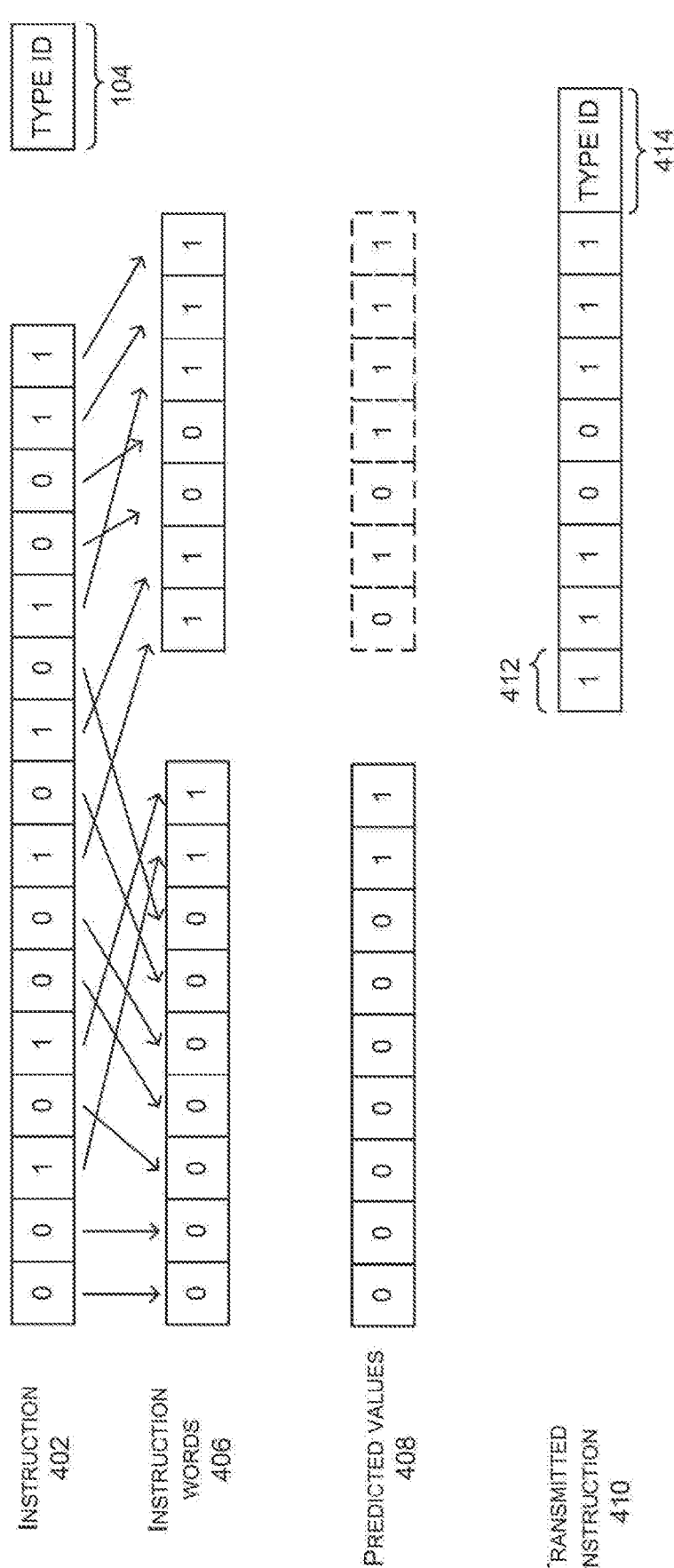
FIG. 4 is a further graphical illustration of the encoding method shown in FIGS. 1 and 2.

Although FIG. 4 shows the first transmitted instruction word in the transmitted instruction 410 comprising the encoding type identifier 414 (e.g. as part of the control bits within that instruction word), in other examples this encoding type identifier may be included in another way within the transmitted instruction 410.

In the method described above, the instruction is compressed prior to transmission through the omission of any instruction words at the end of the sequence of instruction words where all the bits have the predicted values (e.g. by the omission of the second instruction word in the example shown in FIG. 4) or through the omission of instruction words at any point in the sequence through the use of a mask. In various examples, the instruction may be further compressed by re-purposing bits from one field (e.g. the TYPE ID) field, as described with reference to the table above. This technique may also be described as use of variable length encoding type identifiers (or other) fields. For example, if the encoding type identifier 104 comprises three bits, there are eight possible values and eight possible encodings. If, however, there are fewer than eight different values which are used, then one or more of the encoding type identifier field bits (labeled 'TYPE ID' in the FIG. 4) may be re-purposed, e.g. if only four different values are used, then only the first two bits of the encoding type identifier need be used and the remaining bit (the third bit in the encoding type identifier field) can be used to encode other data because its value is irrelevant when decoding the encoding type identifier field.

In the methods described above, the predicted values and/or mapping are determined based on the received encoding type (from block 202) which inherently identifies the ALU type which will execute the instruction, although there may be multiple different encodings for the same ALU type. In a variation of the encoding method described above, the predicted values and/or mapping may additionally be determined based on context information (i.e. in combination with the received encoding type). The context information may, for example, be the type of program (e.g. shader) in which the instruction will be executed (e.g. the program may, for example be a vertex shader, pixel shader or compute shader). In addition, or instead, the context information may be other data which could be determined when executing the program, such as whether the instruction is within a conditionally executing branch, or any other metadata associated with an instruction which does not need to be explicitly encoded in the instruction.

Although the encoding method is shown in FIGS. 1 and 2 as being applied to a compiled instruction (e.g. at the end of the compilation process or later), it will be appreciated that in other examples, the encoding method described may be implemented at an earlier stage within a compiler.

Figure 5:
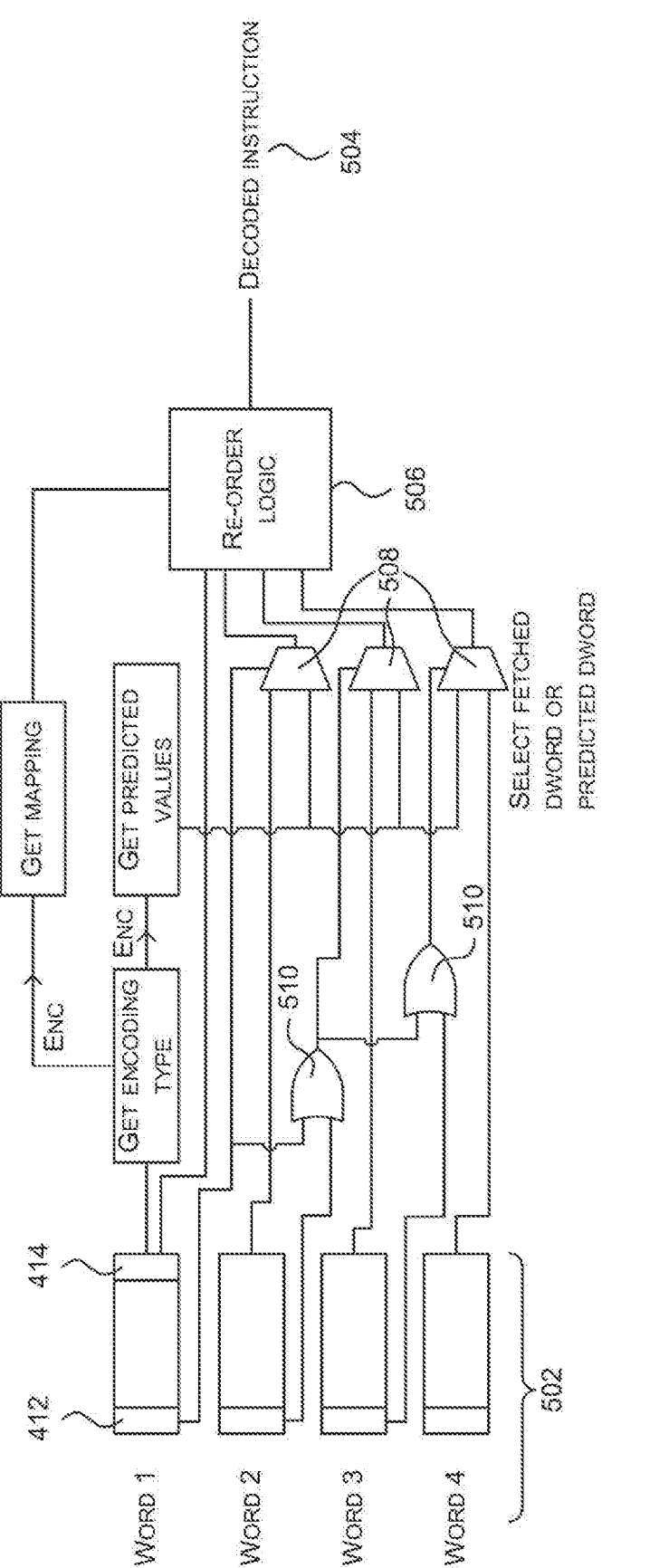
FIG. 5 is a schematic diagram showing an example decoding method.
Figure 6:
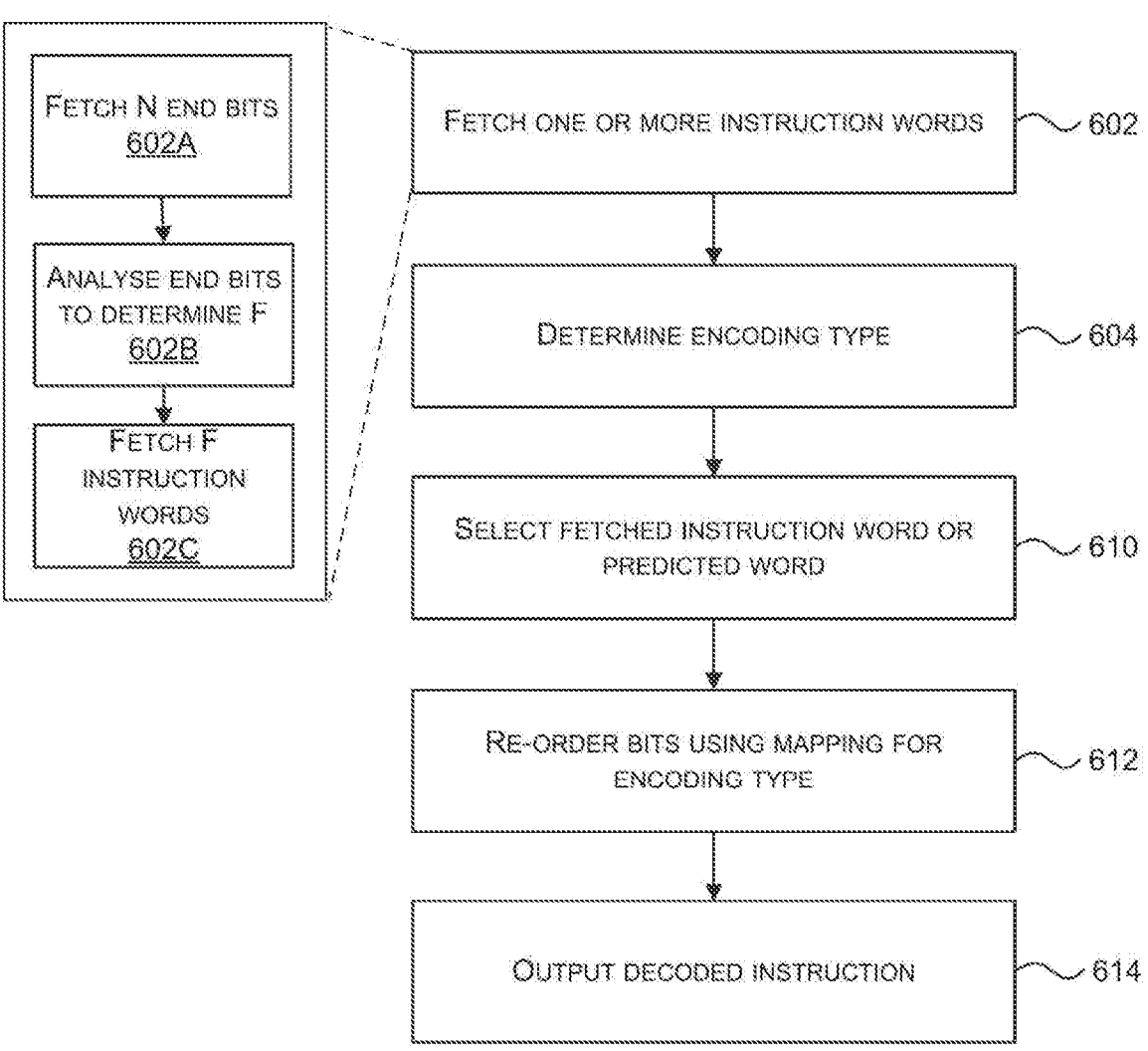
FIG. 6 is a flow diagram showing the decoding method from FIG. 5.

The method of decoding can be described with reference to FIGS. 5-7. FIG. 5 is a schematic diagram showing the decoding method which may be implemented in hardware and/or software, e.g. within a fetch stage and decode stage of a processor. FIG. 6 is a flow diagram showing the decoding method. As shown in FIGS. 5 and 6, one or more instruction words (e.g. F instruction words) 502 are fetched (block 602), e.g. by the instruction fetch unit. In various examples, the fetch operation (in block 602) may be implemented in a number of stages: firstly a plurality of (e.g. N) end bits are fetched (block 602A), then based on the values of the fetched end bits the number of words to be fetched (e.g. F) is determined (block 602B), and then that number of words are fetched (block 602C). By implementing the fetch operation in this way, the bandwidth requirement on the memory in which the instruction words are stored is reduced (because the minimum number of instruction words are fetched). Alternatively, the number of instruction words that are fetched (F, where F is an integer and F≥1) may be fixed or determined in some other way (e.g. by fetching a first instruction word, checking its end bit, depending upon the value of the end bit, fetching another instruction word, checking its end bit, etc.).

In various examples, the end bits (and/or other control bits) may be stored in a separate type of memory (e.g. a lower latency memory) than the rest of the instruction words that are fetched. This enables access to the end bits quickly (due to the lower memory latency).

Having fetched one or more instruction words (in block 602), an encoding type is determined from the fetched instruction words 502 (block 604), e.g. by the decode stage. As described above, each instruction word may comprise a tail portion 412 which may, for example, comprise an end bit, and the first instruction word (from the plurality of instruction words that are fetched) may comprise a portion 414 (e.g. a header portion) which identifies the encoding type used when generating the instruction words (e.g. the encoding type identifier). The encoding type may therefore be determined (in block 604) from this portion 414. The encoding type may, for example, correspond to the ALU type which will execute the particular instruction and optionally other information (e.g. context information).

At this stage, any control bits in the fetched instruction words may be removed. As noted above, in various examples, the end bits (and/or other control bits) may be stored separately from the instruction words so may not need to be removed from the fetched instruction words.

As described above with reference to FIGS. 1-4, a single instruction may be compressed into one or more instruction words, e.g. M instruction words, where M is an integer and 1≤M≤N (or more generally X≤M≤N where X≥1). Consequently, the F instruction words which are fetched (in block 602) comprises M instruction words which correspond to the instruction being decoded and may also comprise F-M instruction words which correspond to one or more subsequent instructions, depending upon the value of F (and where, as described above, the value of F may be different depending upon which level of cache the instruction words are fetched from). As described below, any instruction words which are fetched (in block 602) but which do not relate to the particular instruction which is being decoded, are discarded later in the method (in block 610). In examples where additional words are only fetched when fetching from a higher level of cache (i.e. levels of the cache further from the processor), then these additional words (over and above the M words required) may be considered to be a pre-emptive data fetch and may be used when decoding a subsequent instruction (e.g. assuming that the program counter increments and does not branch).

The encoding type identifier 104 is used to identify (e.g. access) the predicted words (i.e. predicted values for all of the bits in the instruction words) and these predicted words may be stored in a look-up table or in any other manner. The encoding type identifier (or other data in portion 414) is also used to identify (e.g. access) a mapping for the encoding type. The mapping specifies the positions of the bits both in the received instruction words 502 (when arranged in order) and in the decoded instruction 504 and this mapping may be stored in a look-up table or in any other manner. In various examples, the encoding type identifier is used to identify (e.g. access) both the mapping (which is used in block 612) and the predicted words (which are used in block 610). In various examples, other factors, such as the instruction type, context information or any other information that is known by both the compiler/assembler (or other entity that performs the encoding) and the hardware that executes the instruction (and hence performs the decoding) may also be used to identify the predicted words and/or mapping.

In various examples, all the bits in the predicted words may be the same for all instructions and all encoding type identifiers (e.g. all predicted words may comprise bits which are all ones or all zeros or any pre-defined pattern of ones and zeros) in which case there is no need to identify (e.g. access) predicted words.

Having fetched F instruction words (in block 602) and identified the predicted words (e.g. based on the encoding type which is determined in block 604), for each of the N instruction words which make up the instruction, either a fetched instruction word (i.e. one of the F fetched instruction words) or a predicted instruction word is selected (block 610).

In various examples, the selection (in block 610) may be made based on the values of the end bits 412 in one or more of the fetched instruction words, as shown in the example in FIG. 5. In this example, the selection is made by multiplexers 508 which are controlled based on the values of the end bits 412, as combined using OR gates 510. For the first of the N instruction words (which will make up the decoded instruction 504), the first of the F fetched instruction words (WORD1) is always selected (because the transmitted instruction always comprises at least one instruction word). For the second of the N instruction words, the second of the F fetched instructions (WORD2) is selected if the end bit is not set in the first instruction word (WORD1); however, if the end bit is set in the first instruction word (thereby indicating that it is the last instruction word in the transmitted instruction), then the predicted word is selected instead. Similarly, for the $n^{th}$ instruction word that will make up the decoded instruction 504, where $1<n≤N$, the $f^{th}$ fetched instruction word is selected, where $1<f≤F$, unless the end bit is set in any of the preceding fetched instruction words. If the end bit is set in any of the preceding fetched instruction words, or if there is no corresponding fetched instruction word (i.e. because F<N) the predicted word is selected instead.

In the hardware implementation shown in FIG. 5, the predicted words (i.e. the predicted bit values within the predicted words) are data inputs to the multiplexers 508 and the mapping provides control bits for the multiplexers within the re-order (or de-shuffle logic) 506.

The N selected words (from block 610) are placed in order (as noted above, any control bits, which may be in header or tail portions, have already been removed from the words) and then re-ordered (which may also be described as de-shuffling) using the mapping (block 612). The result of the re-ordering operation (in block 612 and logic 506) is the decoded instruction 504 which is output (block 614).

The selection operation (in block 610) and re-ordering operation (in block 612) can further be described with reference to the example shown in FIG. 7 which is the decoding operation which corresponds to the encoding example shown in FIG. 4. As shown in FIG. 7, F instruction words 702 are fetched (in block 602) and in this example F=2. The end bit 412 in the first word 702A is set and consequently, in the selection operation (in block 610), the first fetched instruction word 702A is selected and the second fetched instruction word 702B is not selected and instead the corresponding predicted instruction word (i.e. the predicted second instruction word) is selected. As shown in FIG. 7, prior to performing the selection, any control bits (e.g. the header portion 414 and tail portion 412) are removed and the selection is then performed on the fetched instruction words without the control bits 703.

The selected instruction words 704 (comprising the first fetched instruction word without the control bits 703A and a second predicted instruction word) are then concatenated (i.e. placed in order) to form a shuffled instruction 706 and the mapping for the identified encoding type is used to re-order (or de-shuffle) the bits in the shuffled instruction 706 to produce the re-ordered instruction which may also be referred to as the de-shuffled instruction or decoded instruction 708.

Figure 7:
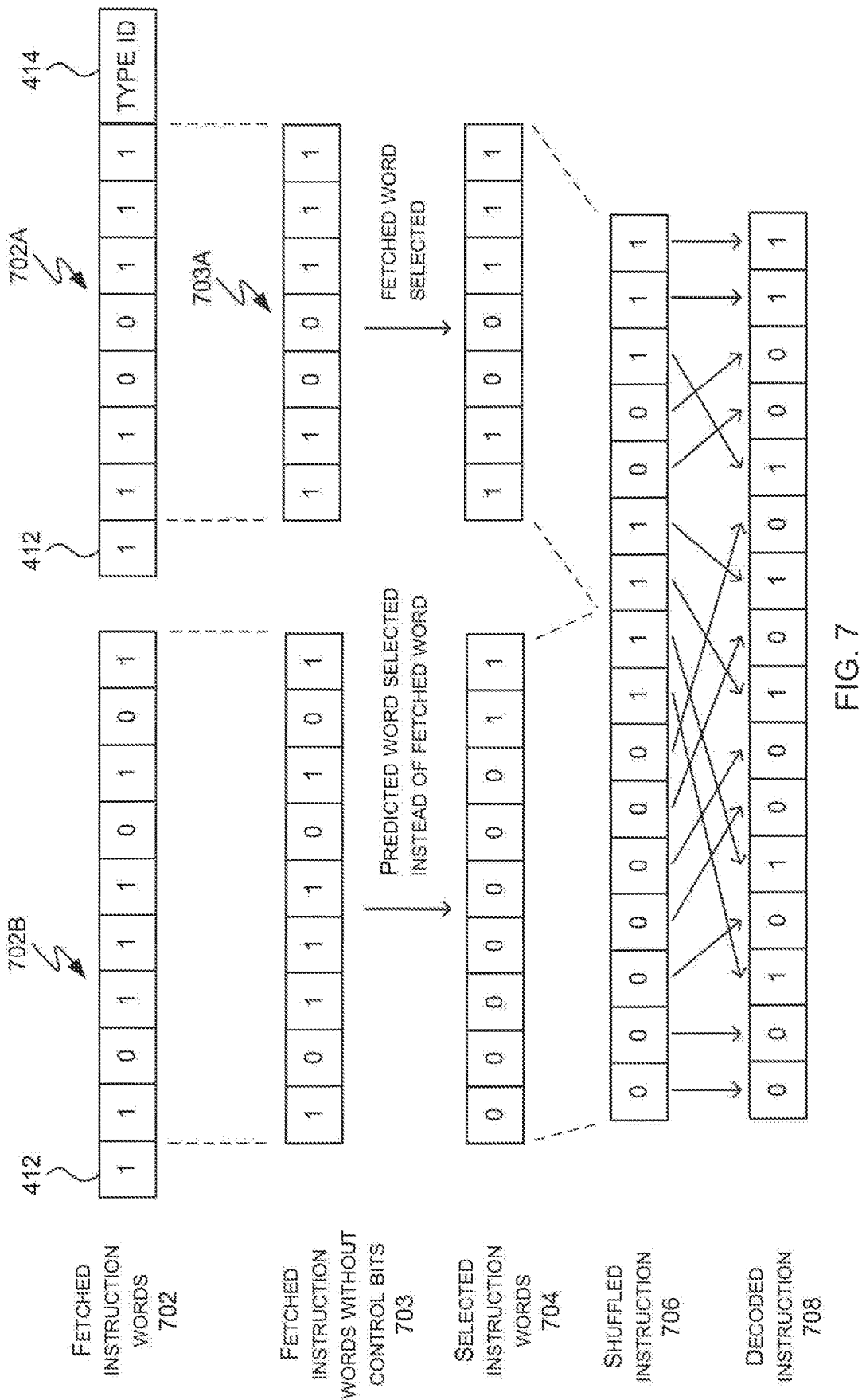
FIG. 7 is a graphical illustration of the decoding method shown in FIGS. 5 and 6.

By comparing the examples shown in FIGS. 4 and 7, it can be seen that the first fetched instruction word 702A corresponds to the transmitted instruction 410 and the second fetched instruction word 702B does not correspond to any instruction word in the transmitted instruction 410 (this second fetched instruction word 702B is part of a next transmitted instruction). The selected instruction words 704 in the decoding operation match the instruction words 408 in the encoding operation and the decoded instruction 708 matches the original instruction 402.

Although the description of FIGS. 6 and 7 above refers to the removal of the control bits before the formation of the shuffled instruction 706 (and hence before the re-ordering operation), in other examples, the control bits may be retained within the instruction words. For example, where bits from the encoding type identifier (TYPE ID, in the header portion 414) are re-purposed (as described with reference to the table above), at least those control bits comprising the encoding type identifier may be retained in the selected instruction words (e.g. only the end bits 412 may be removed) and included in the shuffled instruction.

In the example described above with reference to FIG. 5, the first of the F fetched instruction words (WORD1) is always selected because the transmitted instruction always comprises at least one instruction word. More generally, if the transmitted instruction always comprises at least X instruction words (where X=1 in the example shown but in other examples X may be greater than one, such that X≤M≤N), the first X of the F fetched instruction words are always selected and a decision to select the fetched instruction word or a predicted selection word is only made for subsequent instruction words (e.g. for the $(X+1)^{th}$ to $N^{th}$ instruction words).

In the description of the decoding method above, it is assumed that the compressed instruction was generated by truncating the sequence of instruction words. In other examples, however, and as described above, the compressed instruction may be generated by removing words from any position in the ordered sequence of instruction words using a mask. In such examples, the selection of a fetched instruction word or a predicted word (in block 610) may be made based on a mask identified using the encoding type and in such examples, when selecting the $n^{th}$ instruction word, either the corresponding predicted word or the next fetched instruction (which has not already been selected) is selected. For example, if N=4 and the mask comprises four bits: 0101, for the first of the N instruction words, the first fetched instruction is selected, for the second of the N instruction words, a predicted word is selected, for the third of the N instruction words, the second fetched instruction is selected and for the fourth of the N instruction words, a predicted word is selected.

Although in the decoding examples described above the decoded instruction (output in block 614) comprises the same number of bits, excluding any control bits, as the corresponding received compiled instruction (as received in block 202), again excluding any control bits, and hence there are the same number of instruction words in the ordered sequence formed from the received compiled instruction (in block 204) and the sequence of instruction words generated when decoding (in block 610), in other examples there may be more bits in the decoded instruction, excluding any control bits, than the corresponding received compiled instruction (prior to encoding and again excluding any control bits). This may, for example, occur where an instruction comprises more bits than can be accommodated in the maximum number of instruction words (i.e. in N instruction words). In such examples, the compiler/assembler may generate one of a number of different compiled versions of the same instruction dependent upon how the instruction is being used, with the different versions omitting different fields from the instruction (e.g. one omitting a look-up table field and another omitting a DEST6 field). The compiler/assembler will then select the appropriate compiled version depending upon which fields are unused and the different versions will have different encoding types such that within the decoding operation, the omitted fields are reinserted (in block 610) by selecting a default instruction word.

In some of the examples described above N=2. In other examples described above N=4. In variations on the examples described above, N may have other values, e.g. N may be greater than four. Selection of the value of N and the length of an instruction word provides control over the granularity of the variable length encoding and decoding. A finer granularity, i.e. a larger value of N and smaller length of instructions words, results in a larger overhead (e.g. more instruction word control bits and more hardware logic).

Using the encoding and decoding methods described above, it may be possible to reduce the size of instructions by about 50% (e.g. where N=4, the average value of M for all the instructions in an instruction set may be approximately two). The methods described herein effectively provide a lossless compression method for a shader program. The methods described herein increase the code density and reduce the memory size and memory bandwidth required. Furthermore, the methods provide flexibility to change the mapping (e.g. for different variants of hardware or to add new instructions) without requiring manual changes (i.e. changes made by a person) to the decoding hardware or necessarily significantly decreasing code density. The overall effort required to generate the hardware, software and documentation in relation to the encoding and decoding methods is reduced. The mappings may also be modified based on further usage data or more use-specific usage data to further improve code density without requiring a change in hardware or a change to the compiler/assembler.

Figure 8:
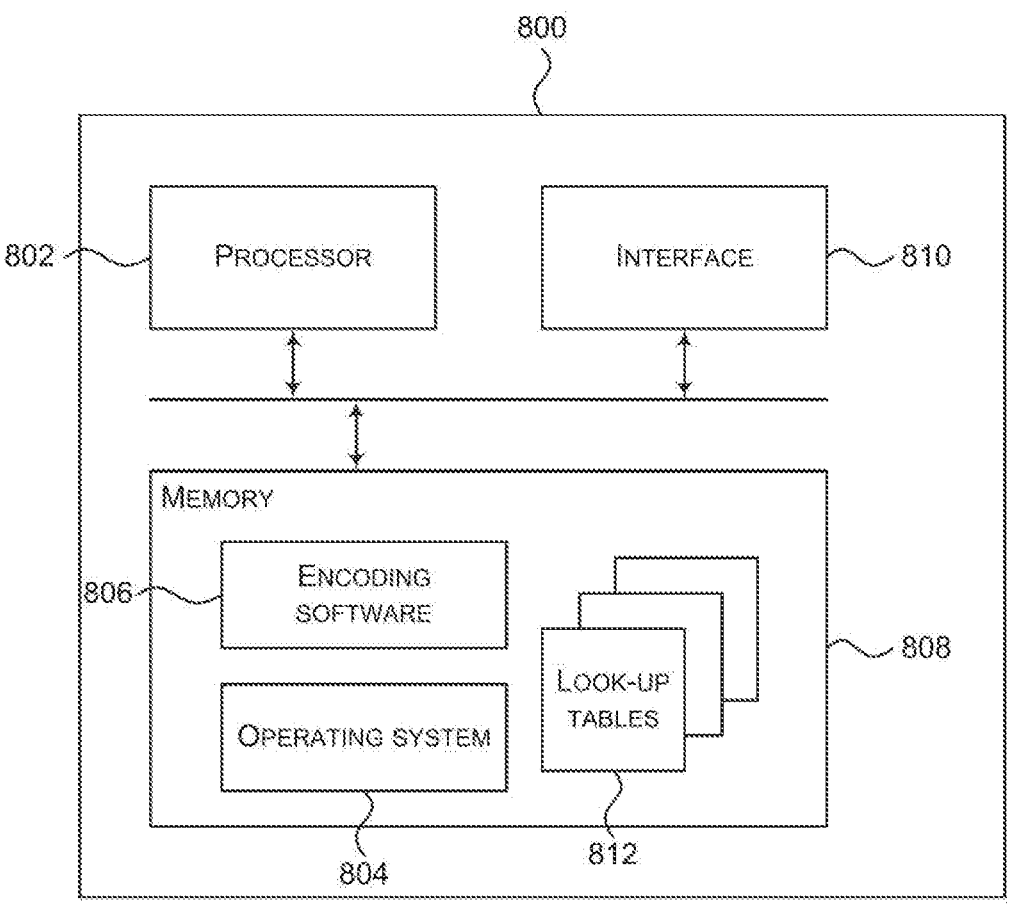
FIG. 8 is a schematic diagram of exemplary computing-based device which may be implemented as any form of a computing and/or electronic device, and in which embodiments of the encoding method of FIGS. 1 and 2 may be implemented.

As described above, the encoding method may be implemented in software which runs on hardware (e.g. a processor) where the software may be a compiler, assembler or software which implements encoding at a later stage (e.g. at run-time). FIG. 8 is a schematic diagram of exemplary computing-based device 800 which may be implemented as any form of a computing and/or electronic device, and in which embodiments of the encoding method described above may be implemented.

Computing-based device 800 comprises one or more processors 802 which may be microprocessors, controllers or any other suitable type of processors for processing computer executable instructions to control the operation of the device in order to implement the encoding method described above. In some examples, for example where a system on a chip architecture is used, the processors 802 may include one or more fixed function blocks (also referred to as accelerators) which implement a part of the method of encoding in hardware (rather than software or firmware). Platform software comprising an operating system 804 or any other suitable platform software may be provided at the computing-based device to enable application software, including encoding software 806 to be executed on the device. The encoding software 806 implements the encoding method described above.

The computer executable instructions may be provided using any computer-readable media that is accessible by computing based device 800. Computer-readable media may include, for example, computer storage media such as memory 808 and communications media. Computer storage media (i.e. non-transitory machine readable media), such as memory 808, includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transport mechanism. As defined herein, computer storage media does not include communication media. Although the computer storage media (i.e. non-transitory machine readable media, e.g. memory 808) is shown within the computing-based device 800 it will be appreciated that the storage may be distributed or located remotely and accessed via a network or other communication link (e.g. using interface 810).

As well as storing computer-executable instructions which can be executed by the processor 802, the memory 808 may also store one or more look-up tables 812 comprising the mappings and/or predicted values described above. Alternatively, the mappings and/or predicted values may be accessed via the interface 810. The compiled instructions which are encoded by the encoding software 806 (when executed by the processor 802) may be stored in the memory 808, received via the interface 810 or generated by the processor 802 (e.g. running other software, such as a compiler and/or assembler program, which may be stored in memory 800).

The computing-based device 800 may also comprise additional elements which are not shown in FIG. 8, such as an input/output controller arranged to output display information to a display device which may be separate from or integral to the computing-based device 800. The display information may provide a graphical user interface. The input/output controller, where provided, may also be arranged to receive and process input from one or more devices, such as a user input device (e.g. a mouse or a keyboard). The display device may also function as the user input device if it is a touch sensitive display device. The input/output controller, where provided, may also output data to devices other than the display device, e.g. a locally connected printing device.

As described above, the decoding method may be implemented in hardware and/or software, e.g. within a decode stage of a processor. Where the decoding method is implemented entirely in software, it may be implemented on a computing-based device such as the one shown in FIG. 8 and described above, with the memory 808 being arranged to store decoding software which can be executed by the processor 802.

Figure 9:
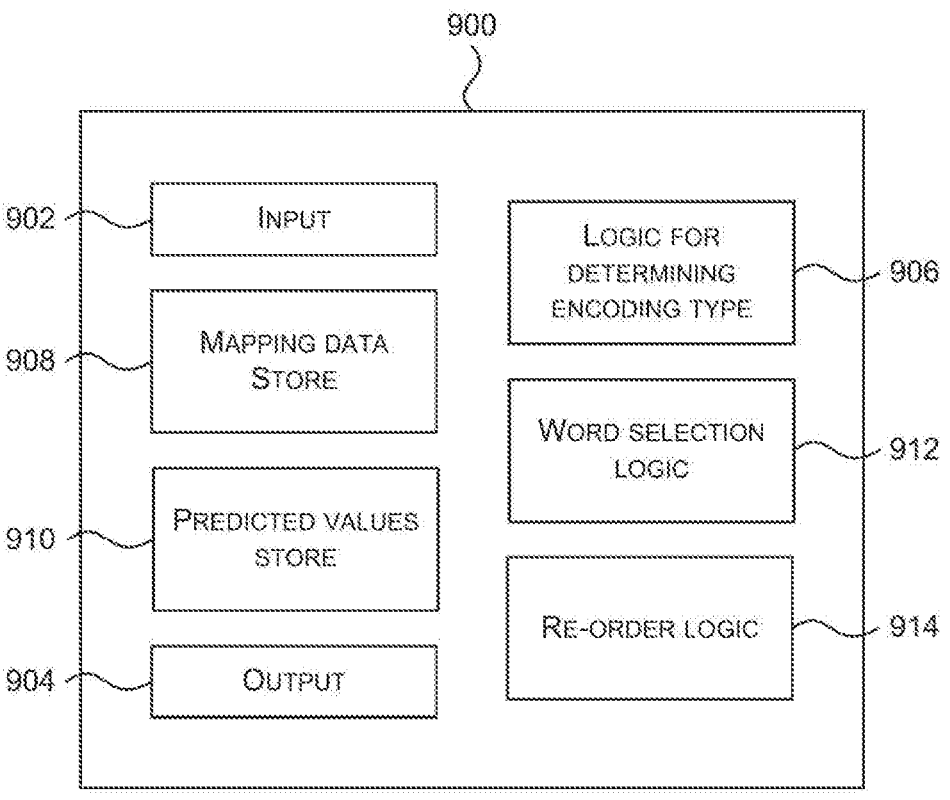
FIG. 9 is a schematic diagram of example decoding hardware which implements the decoding method of FIGS. 5 and 6.

FIG. 9 is a schematic diagram of example decoding hardware 900 which implements the decoding method described above. As described above, this decoding hardware 900 may be part of a decode stage of a processor (e.g. a CPU or GPU). As shown in FIG. 9, the decoding hardware 900 comprises an input 902 for receiving fetched instruction words 502 (which may, for example, have been fetched by a fetch stage of the processor) and an output 904 for outputting decoded instructions 504 (e.g. to an execution stage of the processor which comprises a plurality of ALUs).

The instruction words may be fetched from within a memory hierarchy (not shown in FIG. 9). As described above, the instruction words may be stored and fetched differently depending upon the particular cache level. For example, where instruction words are stored in higher levels of the cache, the some or all of the control bits (e.g. the end bits) may be stored separately from the rest of the instruction words (e.g. in a different type of memory) and may be fetched ahead of the instruction words themselves (as shown in blocks 602A-C in FIG. 6) and where instruction words are stored in lower levels of the hierarchy (e.g. lower levels of cache), some or all of the control bits (e.g. the end bits) may be stored with the rest of the instruction words such that an instruction word is fetched at the same time as the end bit (or other control bits) for that particular instruction word.

The hardware 900 further comprises logic 906 for determining the encoding type (e.g. from the fetched instruction words and optionally context information) and data stores for the mapping data 908 and the predicted values 910. As described above, the mappings and the predicted values may be stored in any way, e.g. in look-up tables (in memory) and the mappings and predicted values may be stored independently and/or in different manners. The hardware 900 further comprises word selection logic 912 which may, for example, comprise an arrangement of logic gates (such as OR gates 510 as shown in FIG. 5) and multiplexers (such as the multiplexers 508 shown in FIG. 5). The predicted values may be used as inputs to the logic within the word selection logic 912 (e.g. as described above with reference to FIG. 5). The hardware 900 additionally comprises re-ordering logic 914 (which may alternatively be referred to as 'de-shuffle logic'). The mapping data (as stored in the mapping data store 908) may be a look-up table for control bits used within the re-order logic.

Although FIG. 9 shows the word selection logic 912 and re-order logic 914 as separate functional entities, in various examples parts of the word selection functionality 912 may be integrated within the re-order logic 914. In such an example, the hardware 900 may comprise three functions: logic for determining the encoding type 906, logic for returning the predicted values (which may be part of logic 912) and logic for de-shuffling the instruction (which comprises the remaining parts of logic 912 and the re-order logic 914).

Although FIG. 9 shows the mapping data store 908 separately from the re-order logic 914, in various examples, the mapping data store 908 may be integrated into the re-order logic 914. As described above the mapping data may be a look-up table for control bits used within the re-order logic 914 (e.g. control bits for multiplexers or other logic elements) and the two (the mapping data store 908 and re-order logic 814) may be merged together during synthesis of the hardware to reduce the overall amount of hardware logic required to implement the decoding method.

A tool which automatically generates both the encoding software 806 and the hardware description for the decoding apparatus 900 can be described with reference to FIG. 10. This tool may generate software for use in implementing the decoding method described herein (e.g. decoding software which may be run on an apparatus similar to that shown in FIG. 8) in addition to, or instead of the hardware description of the decoding apparatus 900. Additionally the tool may also automatically generate human-readable documentation detailing the mapping used to re-arrange the bits for a particular encoding (or mapping) type and/or perform analysis to optimize the mappings used. As described above by generating both the encoding software and the decoding hardware/software together, the possibility of errors caused by a mismatch between the encoding and decoding processes used is significantly reduced and this improves reliability. By additionally generating human-readable documentation at the same time, the possibility of errors is further reduced (and hence reliability is further improved) and the effort required is significantly reduced.

Figure 10:
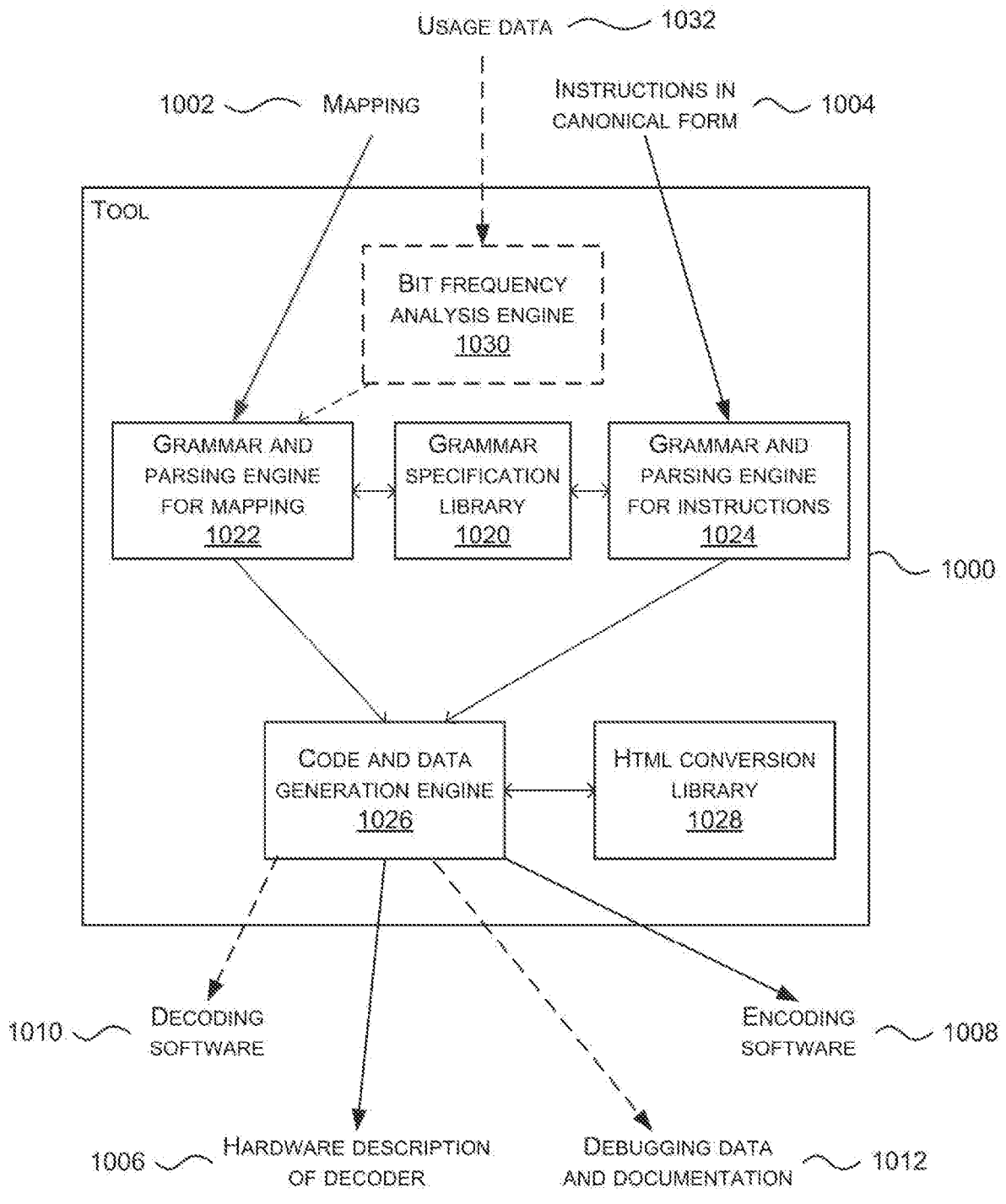
FIG. 10 is a schematic diagram of a software tool arranged to automatically generate hardware and software to implement the encoding and decoding methods described herein.

FIG. 10 is a schematic diagram of a tool 1000 (e.g. a software tool that runs on a processor, such as processor 802). As shown in FIG. 10, the tool 1000 takes as inputs a mapping 1002 and the instructions in an instruction set in canonical form 1004. The canonical form of an instruction is the form of the instruction when it is generated by the compiler/assembler or executed in hardware (e.g. instructions 402, 708). It may be presented to the tool in a human readable or machine readable form. The tool 1000 generates and outputs a hardware description of the decoding apparatus 1006 (e.g. in VHDL, Verilog or other hardware description language) and encoding software 1008 (e.g. in C). These outputs 1006, 1008 include the mapping data and/or predicted values which may be in the form of look-up tables or in any other form (e.g. for the look-up tables 812 shown in FIG. 8 and the mapping data store 908 and predicted values store 910 shown in FIG. 9) and/or values for enumerated data types. The tool 100 may also generate and output decoding software 1010 (e.g. in C, where this may be provided in addition to, or instead of the hardware description 1006) and/or debugging data and documentation 1012 which is in a human-readable form (e.g. in HTML). The tool 1000 may additionally provide other outputs not shown in FIG. 10.

As shown in FIG. 10, the tool 1000 comprises two grammar and parsing engines 1022, 1024, one for the mapping 1002 and the other for the instructions 1004. Both of these engines access a grammar and specification library 1020 to perform the parsing. The grammar and parsing engine for the mapping 1022 outputs a remapping table which details how bits are re-ordered (e.g. in blocks 204 and 612) and which may alternatively be referred to as a re-ordering or a shuffling table. The grammar and parsing engine for the instructions 1024 outputs an internal representation of the canonical instruction format which is suitable for further processing and code generation. The output of these two engines 1022, 1024 is fed into a code and data generation engine 1026 and used to generate the code 1008, 1010 and other outputs 1006, 1012 of the tool 1000. The code and data generation engine 1026 accesses a second library (referred to herein as the HTML conversion library 1028), to convert comments (e.g. programming comments) to HTML.

In various examples, the tool 1000 may additionally receive usage data 1032, such as statistical data relating to the instructions generated using the encoding software 1008 for the instruction set (e.g. in one or more different applications) and may comprise an analysis engine 1030 (e.g. a bit frequency analysis engine) which generates statistics regarding the frequency with which each bit in an instruction is toggled and/or differs from the predicted value (e.g. it may perform instruction bit frequency analysis) and may then feedback updated (e.g. optimized) mappings into the tool to further optimize the encoding and decoding methods used.

Figure 11:
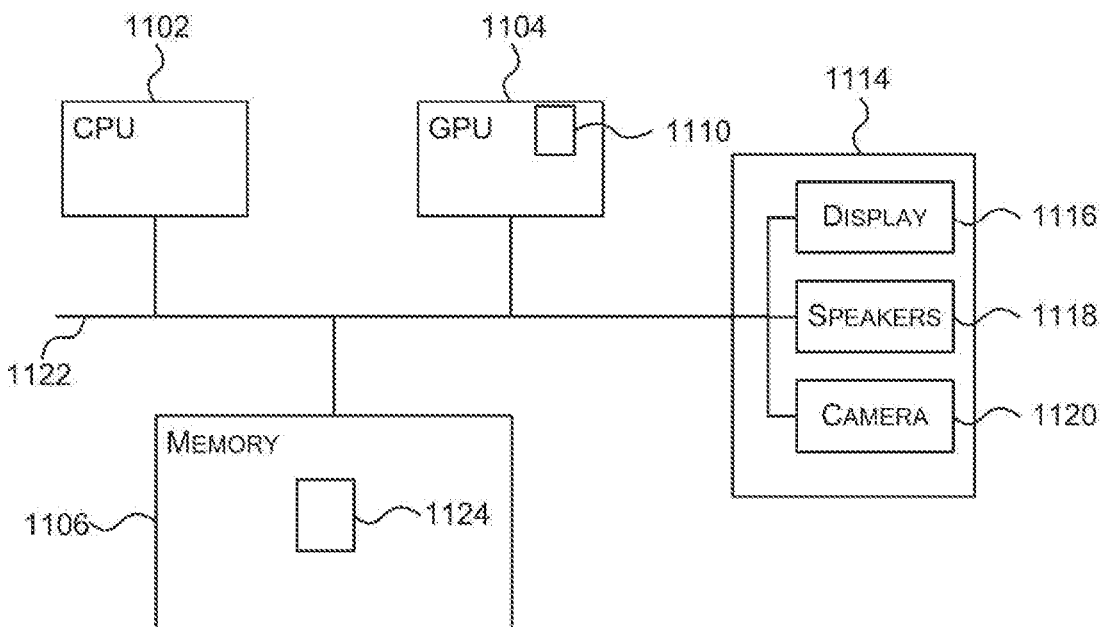
FIG. 11 shows a computer system in which the encoding and/or decoding methods described herein may be implemented.

FIG. 11 shows a computer system 1100 in which the decoding apparatus described herein may be implemented. The computer system comprises a CPU 1102, a GPU 1104, a memory 1106 and other devices 1114, such as a display 1116, speakers 1118 and a camera 1120. A processing block 1110 (corresponding to the decoding apparatus 900) is implemented on the GPU 1104. In other examples, the processing block 1110 may be implemented on the CPU 1102. The components of the computer system can communicate with each other via a communications bus 1122. A store 1124 (corresponding to the mapping data store 908 and/or predicted values store 910) may be implemented as part of the memory 1106.

The decoding apparatus of FIG. 9 is shown as comprising a number of functional blocks. This is schematic only and is not intended to define a strict division between different logic elements of such entities. Each functional block may be provided in any suitable manner. It is to be understood that intermediate values described herein as being formed by the decoding apparatus need not be physically generated by the decoding apparatus at any point and may merely represent logical values which conveniently describe the processing performed by the decoding apparatus between its input and output.

The decoding apparatus described herein may be embodied in hardware on an integrated circuit. The decoding apparatus described herein may be configured to perform any of the decoding methods described herein. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, byte-code, code defining an integrated circuit (such as a hardware description language or netlist), and code expressed in a programming language code such as C, Java, GLSL or OpenCL C. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), physics processing units (PPUs), radio processing units (RPUs), digital signal processors (DSPs), general purpose processors (e.g. a general purpose GPU), microprocessors, any processing unit which is designed to accelerate tasks outside of a CPU, etc. A computer or computer system may comprise one or more processors. Those skilled in the art will realize that such processing capabilities are incorporated into many different devices and therefore the term 'computer' includes set top boxes, media players, digital radios, PCs, servers, mobile telephones, personal digital assistants and many other devices.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed in an integrated circuit manufacturing system configures the system to manufacture a decoding apparatus configured to perform any of the decoding methods described herein, or to manufacture a processor comprising any apparatus described herein. An integrated circuit definition dataset may be, for example, an integrated circuit description.

An integrated circuit definition dataset may be in the form of computer code, for example as a netlist, code for configuring a programmable chip, as a hardware description language defining an integrated circuit at any level, including as register transfer level (RTL) code, as high-level circuit representations such as Verilog or VHDL, and as low-level circuit representations such as OASIS® and GDSII. Higher level representations which logically define an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture apparatus to perform the encoding and/or decoding methods described above will now be described with respect to FIG. 12.

Figure 12:
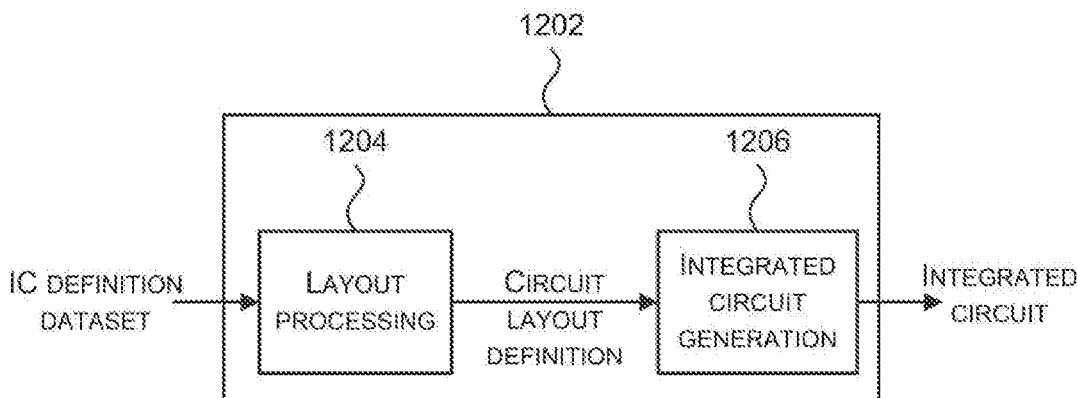
FIG. 12 shows an integrated circuit manufacturing system for generating an integrated circuit embodying a decoding and/or encoding apparatus as described herein.

FIG. 12 shows an example of an integrated circuit (IC) manufacturing system 1202 which comprises a layout processing system 1204 and an integrated circuit generation system 1206. The IC manufacturing system 1202 is configured to receive an IC definition dataset (e.g. defining an encoding and/or decoding apparatus as described in any of the examples herein and which may, for example, be generated by tool 1000), process the IC definition dataset, and generate an IC according to the IC definition dataset (e.g. which embodies an encoding and/or decoding apparatus as described in any of the examples herein). The processing of the IC definition dataset configures the IC manufacturing system 1202 to manufacture an integrated circuit embodying an encoding and/or decoding apparatus as described in any of the examples herein.

The layout processing system 1204 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1204 has determined the circuit layout it may output a circuit layout definition to the IC generation system 1206. A circuit layout definition may be, for example, a circuit layout description.

The IC generation system 1206 generates an IC according to the circuit layout definition, as is known in the art. For example, the IC generation system 1006 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1206 may be in the form of computer-readable code which the IC generation system 1206 can use to form a suitable mask for use in generating an IC.

The different processes performed by the IC manufacturing system 1202 may be implemented all in one location, e.g. by one party. Alternatively, the IC manufacturing system 1202 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture an encoding and/or decoding apparatus without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 12 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 12, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

Further aspects and examples are set out in the following clauses:

Clause 1. A method of encoding instructions from an instruction set, the method comprising: receiving an instruction from the instruction set; re-ordering and grouping bits in the received instruction into a plurality of instruction words according to an encoding type to generate an ordered sequence of instruction words; comparing bit values in one or more of the instruction words in the ordered sequence to their corresponding predicted values and generating a compressed version of the instruction by omitting one or more of the instruction words in the ordered sequence based on the comparison, wherein the predicted values are generated using empirical and/or simulation data; and outputting the compressed version of the instruction.

Clause 2. The method according to clause 1, wherein the compressed versions of different groups of instructions within the instruction set comprise different numbers of instruction words.

Clause 3. The method according to clause 1 or 2, wherein generating a compressed version of the instruction comprises: omitting one or more instruction words from the ordered sequence that only comprise bits that have values that match the predicted values for those bits.

Clause 4. The method according to clause 3, generating a compressed version of the instruction further comprises:

setting one or more bits to indicate which instruction words have been omitted from the ordered sequence.

Clause 5. The method according to clause 4, wherein setting one or more bits to indicate which instruction words have been omitted from the ordered sequence comprises: setting a plurality of bits in a mask to indicate which instruction words have been omitted from the ordered sequence.

Clause 6. The method according to clause 4, wherein setting one or more bits to indicate which instruction words have been omitted from the ordered sequence comprises: setting an end bit in an instruction word if all following instruction words in the ordered sequence comprise bits which have values which match their predicted values, and wherein the compressed version of the instruction comprises only those instruction words from the sequence prior to the instruction word in which the end bit was set and the instruction word in which the end bit was set.

Clause 7. The method according to any of the preceding clauses, wherein re-ordering and grouping bits in the received instruction into a plurality of instruction words according to an encoding type to generate an ordered sequence of instruction words comprises: accessing mapping data according to the encoding type; and re-ordering and grouping bits in the received instruction using the accessed mapping data to generate an ordered sequence of instruction words.

Clause 8. The method according to any of the preceding clauses, further comprising: accessing the predicted values for bits in the ordered sequence of instruction words according to the encoding type.

Clause 9. The method according to any of the preceding clauses, further comprising receiving an identifier for the encoding type.

Clause 10. The method according to any of the preceding clauses, wherein the encoding type corresponds to a type of ALU on which the instruction will be executed.

Clause 11. The method according to any of the preceding clauses, wherein the received instruction is a compiled instruction.

Clause 12. The method according to clause 11, wherein the method is implemented by a compiler or assembler following generation of a compiled instruction.

Clause 13. The method according to any of clauses 1-11, wherein the method is implemented when loading a program into processor memory.

Clause 14. The method according to any of the preceding clauses, wherein the method is implemented by a processor executing device-executable instructions stored in memory.

Clause 15. A device for encoding instructions from an instruction set, the device comprising: a processor; and a memory arranged to store device-executable instructions configured, when executed by the processor, to cause the processor, in response to receiving an instruction from an instruction set, to: re-order and group bits in the received instruction into a plurality of instruction words according to an encoding type to generate an ordered sequence of instruction words; compare bit values in one or more of the instruction words in the ordered sequence to their corresponding predicted values, wherein the predicted values are generated using empirical and/or simulation data; generate a compressed version of the instruction by omitting one or more of the instruction words in the ordered sequence based on the comparison between the bit values in one or more of the instruction words in the ordered sequence and their corresponding predicted values; and output the compressed version of the instruction.

Clause 16. A method of decoding instructions comprising: receiving, in a decode stage of a processor, one or more fetched instruction words; determining an encoding type from one or more of the fetched instruction words; generating an ordered sequence of instruction words by selecting, for each of the instruction words in the sequence, either a fetched instruction word or a predicted instruction word, wherein the predicted instruction words are generated using empirical and/or simulation data; concatenating the instruction words in the ordered sequence to form an encoded instruction and re-ordering bits in the encoded instruction according to the encoding type to generate a decoded instruction; and outputting the decoded instruction.

Clause 17. The method according to clause 16, further comprising: fetching, in a fetch stage of a processor, one or more instruction words from memory.

Clause 18. The method according to clause 17, wherein the one or more fetched instruction words comprises a pre-defined number of instruction words.

Clause 19. The method according to clause 17, wherein fetching one or more instructions from memory comprises: fetching one or more control bits from a plurality of instruction words; determining a number of instruction words to fetch based on the fetched control bits; and fetching the number of instruction words.

Clause 20. The method according to any of clauses 16-19, further comprising: removing one or more control bits from the fetched instruction words prior to generating the ordered sequence of instruction words.

Clause 21. The method according to clause 20, wherein removing one or more control bits from the fetched instruction words prior to generating the ordered sequence of instruction words comprises: removing any control bits from the fetched instruction words prior to generating the ordered sequence of instruction words.

Clause 22. The method according to any of clauses 16-21, wherein the one or more fetched instruction words comprises an ordered sequence of fetched instruction words and generating an ordered sequence of instruction words by selecting, for each of the instruction words in the sequence, either a fetched instruction word or a predicted instruction word comprises: selecting, for each of the instruction words in the sequence, either a corresponding fetched instruction word or a corresponding predicted instruction word.

Clause 23. The method according to clause 22, wherein each fetched instruction word comprises one or more control bits and wherein the selection of the fetched instruction word or a corresponding predicted instruction word is based on values of one or more of the control bits in any prior fetched instruction words in the ordered sequence.

Clause 24. The method according to any of clauses 16-21, wherein the one or more fetched instruction words comprises an ordered sequence of fetched instruction words and generating an ordered sequence of instruction words by selecting, for each of the instruction words in the sequence, either a fetched instruction word or a predicted instruction word comprises: selecting, for each of the instruction words in the sequence, either a next fetched instruction word in the ordered sequence of fetched instruction words or a corresponding predicted instruction word.

Clause 25. The method according to clause 24, wherein the selection of either a next fetched instruction word in the ordered sequence of fetched instruction words or a corresponding predicted instruction word is made based upon a value of a bit in a mask identified based on the encoding type.

Clause 26. The method according to any of clauses 16-25, wherein re-ordering bits in the encoded instruction according to the encoding type to generate a decoded instruction comprises: re-ordering bits in the encoded instruction based on mapping data identified based on the encoding type.

Clause 27. The method according to any of clauses 16-26, wherein determining an encoding type from one or more of the fetched instruction words comprises: determining an encoding type from one or more control bits in a first of the fetched instruction words.

Clause 28. The method according to any of clauses 16-27, wherein the encoding type corresponds to a type of ALU on which the instruction will be executed.

Clause 29. Decoding hardware comprising: an input arranged to receive one or more fetched instruction words; hardware logic configured to determine an encoding type from one or more of the fetched instruction words; word selection logic configured to generate an ordered sequence of instruction words by selecting, for each of the instruction words in the sequence, either a fetched instruction word or a predicted instruction word, wherein the predicted instruction words are generated using empirical and/or simulation data, and to concatenate the instruction words in the ordered sequence to form an encoded instruction; re-order hardware logic configured to re-order bits in the encoded instruction according to the encoding type to generate a decoded instruction; and an output arranged to output the decoded instruction.

Clause 30. The decoding hardware according to clause 29, wherein the word selection logic is further configured to remove one or more control bits from the fetched instruction words prior to generating the ordered sequence of instruction words.

Clause 31. The decoding hardware according to clause 29, wherein the word selection logic is further configured to remove any control bits from the fetched instruction words prior to generating the ordered sequence of instruction words.

Clause 32. The decoding hardware according to any of clauses 29-31, wherein the one or more fetched instruction words comprises an ordered sequence of fetched instruction words and the word selection logic is configured to generate an ordered sequence of instruction words by selecting, for each of the instruction words in the sequence, either a corresponding fetched instruction word or a corresponding predicted instruction word.

Clause 33. The decoding hardware according to clause 32, wherein each fetched instruction word comprises one or more control bits and wherein the word selection logic is configured to perform the selection of the fetched instruction word or a corresponding predicted instruction word based on values of one or more of the control bits in any prior fetched instruction words in the ordered sequence.

Clause 34. The decoding hardware according to any of clauses 29-31, wherein the one or more fetched instruction words comprises an ordered sequence of fetched instruction words and the word selection logic is configured to generate an ordered sequence of instruction words by selecting, for each of the instruction words in the sequence, either a next corresponding fetched instruction word or a corresponding predicted instruction word.

Clause 35. The decoding hardware according to clause 34, wherein the word selection logic is configured to perform the selection of either a next fetched instruction word in the ordered sequence of fetched instruction words or a corresponding predicted instruction word based upon a value of a bit in a mask identified based on the encoding type.

Clause 36. The decoding hardware according to any of clauses 29-35, wherein the re-order hardware logic is configured to re-order bits in the encoded instruction according to the encoding type to generate a decoded instruction by re-ordering bits in the encoded instruction based on mapping data identified based on the encoding type.

Clause 37. The decoding hardware according to any of clauses 29-36, wherein the hardware logic configured to determine an encoding type is arranged to determine an encoding type from one or more control bits in a first of the fetched instruction words.

Clause 38. The decoding hardware according to any of clauses 29-37, wherein the encoding type corresponds to a type of ALU on which the instruction will be executed.

Clause 39. A processor comprising a decode stage, wherein the decode stage comprises decoding hardware according to any of clauses 29-38.

Clause 40. The processor according to clause 39, further comprising a fetch stage configured to fetch one or more instruction words from memory.

Clause 41. The processor according to clause 40, wherein the one or more fetched instruction words comprises a pre-defined number of instruction words.

Clause 42. The processor according to clause 40, wherein the fetch stage is configured to fetch one or more control bits from a plurality of instruction words; determine a number of instruction words to fetch based on the fetched control bits; and fetch the number of instruction words.

Clause 43. A device for decoding instructions from an instruction set, the device comprising: a processor; and a memory arranged to store device-executable instructions configured, when executed by the processor, to cause the processor, in response to receiving one or more fetched instruction words, to: determine an encoding type from one or more of the fetched instruction words; generate an ordered sequence of instruction words by selecting, for each of the instruction words in the sequence, either a fetched instruction word or a predicted instruction word, wherein the predicted instruction words are generated using empirical and/or simulation data; concatenate the instruction words in the ordered sequence to form an encoded instruction and re-ordering bits in the encoded instruction according to the encoding type to generate a decoded instruction; and output the decoded instruction.

Clause 44. A method of manufacturing, using an integrated circuit manufacturing system, decoding hardware as claimed in any of clauses 29-38.

Clause 45. An integrated circuit definition dataset that, when processed in an integrated circuit manufacturing system, configures the integrated circuit manufacturing system to manufacture decoding hardware as claimed in any of clauses 29-38.

Clause 46. A computer readable storage medium having stored thereon a computer readable description of an integrated circuit that, when processed in an integrated circuit manufacturing system, causes the integrated circuit manufacturing system to manufacture decoding hardware as claimed in any of clauses 29-38.

Clause 47. An integrated circuit manufacturing system configured to manufacture decoding hardware as claimed in any of clauses 29-38.

Clause 48. An integrated circuit manufacturing system comprising: a non-transitory computer readable storage medium having stored thereon a computer readable description of an integrated circuit that describes decoding hardware; a layout processing system configured to process the integrated circuit description so as to generate a circuit layout description of an integrated circuit embodying the decoding hardware; and an integrated circuit generation system configured to manufacture the decoding hardware according to the circuit layout description, wherein the decoding hardware comprises: an input arranged to receive one or more fetched instruction words; hardware logic configured to determine an encoding type from one or more of the fetched instruction words; word selection logic configured to generate an ordered sequence of instruction words by selecting, for each of the instruction words in the sequence, either a fetched instruction word or a predicted instruction word, wherein the predicted instruction words are generated using empirical and/or simulation data, and to concatenate the instruction words in the ordered sequence to form an encoded instruction; re-order hardware logic configured to re-order bits in the encoded instruction according to the encoding type to generate a decoded instruction; and an output arranged to output the decoded instruction.

Clause 49. A method comprising: receiving, at an input, mapping data for an instruction set and instruction data describing instructions in an instruction set in canonical form; parsing the mapping data and instruction data using a grammar library; generating, in a code and data generation engine, both encoding software and a hardware description of a decoder based on the parsed mapping data and instruction data; and outputting the encoding software and the hardware description of a decoder.

Clause 50. The method according to clause 49, further comprising: generating debugging data and documentation in human-readable form in the code and data generation engine and based on the parsed mapping data and instruction data; and outputting the debugging data and documentation in human-readable form.

Clause 51. A device comprising: a processor; and a memory arranged to store device-executable instructions configured, when executed by the processor, to cause the processor, in response to receiving mapping data for an instruction set and instruction data describing instructions in an instruction set in canonical form, to: parse the mapping data and instruction data using a grammar library; generate both encoding software and a hardware description of a decoder based on the parsed mapping data and instruction data; and output the encoding software and the hardware description of a decoder.

Clause 52. A processor configured to perform the method of any of clauses 1-14, 16-28 and 49-50.

Clause 53. Computer readable code configured to cause the method of any of clauses 1-14, 16-28 and 49-50 to be performed when the code is run.

Clause 54. A computer readable storage medium having encoded thereon the computer readable code of clause 53.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

The methods described herein may be performed by a computer configured with software in machine readable form stored on a tangible storage medium e.g. in the form of a computer program comprising computer readable program code for configuring a computer to perform the constituent portions of described methods or in the form of a computer program comprising computer program code means adapted to perform all the steps of any of the methods described herein when the program is run on a computer and where the computer program may be embodied on a computer readable storage medium. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

Memories storing machine executable data for use in implementing disclosed aspects can be non-transitory media. Non-transitory media can be volatile or non-volatile. Examples of volatile non-transitory media include semiconductor-based memory, such as SRAM or DRAM. Examples of technologies that can be used to implement non-volatile memory include optical and magnetic memory technologies, flash memory, phase change memory, resistive RAM.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and an apparatus may contain additional blocks or elements and a method may contain additional operations or elements. Furthermore, the blocks, elements and operations are themselves not impliedly closed.

The steps of the methods described herein may be carried out in any suitable order, or simultaneously where appropriate. The arrows between boxes in the figures show one example sequence of method steps but are not intended to exclude other sequences or the performance of multiple steps in parallel. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. Decoding hardware comprising:

hardware logic configured to determine an encoding type from a fetched instruction word;

word selection logic configured to generate an ordered sequence of instruction words by selecting, for each of the instruction words in the sequence, either the fetched instruction word or a predicted instruction word, and to concatenate the instruction words in the ordered sequence to form an encoded instruction;

re-order hardware logic configured to re-order bits in the encoded instruction to generate a decoded instruction; and an output arranged to output the decoded instruction.

2. The decoding hardware according to claim 1, wherein the word selection logic is further configured to remove one or more control bits from the fetched instruction words prior to generating the ordered sequence of instruction words.

3. The decoding hardware according to claim 1, wherein the word selection logic is further configured to remove any control bits from the fetched instruction words prior to generating the ordered sequence of instruction words.

4. The decoding hardware according to claim 1, wherein the fetched instruction word comprises one or more control bits and wherein the word selection logic is configured to perform the selection of the fetched instruction word or a corresponding predicted instruction word based on values of one or more of the control bits.

5. The decoding hardware according to claim 1, wherein the fetched instruction word is selected from an ordered sequence of fetched instruction words and the word selection logic is configured to generate an ordered sequence of instruction words by selecting, for each of the instruction words in the sequence, either a next corresponding fetched instruction word or a corresponding predicted instruction word.

6. The decoding hardware according to claim 5, wherein the word selection logic is configured to perform the selection of either a next fetched instruction word in the ordered sequence of fetched instruction words or a corresponding predicted instruction word based upon a value of a bit in a mask identified based on an encoding type.

7. The decoding hardware according to claim 1, wherein the re-order hardware logic is configured to re-order bits in the encoded instruction according to the encoding type to generate a decoded instruction by re-ordering bits in the encoded instruction based on mapping data identified based on an encoding type.

8. The decoding hardware according to claim 1, wherein the hardware logic is configured to determine an encoding type, wherein the hardware logic is further arranged to determine the encoding type from one or more control bits in the fetched instruction word.

9. The decoding hardware according to claim 8, wherein the encoding type corresponds to a type of Arithmetic Logic Unit (ALU) on which the instruction will be executed.

10. A method of decoding instructions comprising:
determining an encoding type from a fetched instruction word;
generating an ordered sequence of instruction words by selecting, for each of the instruction words in the sequence, the fetched instruction word or a predicted instruction word;
concatenating the instruction words in the ordered sequence to form an encoded instruction and re-ordering bits in the encoded to generate a decoded instruction; and
outputting the decoded instruction.

11. The method according to claim 10, further comprising:
fetching, in a fetch stage of a processor, an instruction word from memory.

12. The method according to claim 11, wherein the fetched instruction word is selected from one of a predefined number of instruction words.

13. An integrated circuit manufacturing system comprising:
a non-transitory computer readable storage medium having stored thereon a computer readable dataset description of an integrated circuit that describes decoding hardware as set forth in claim 1;
a layout processing system configured to process the integrated circuit description so as to generate a circuit layout description of an integrated circuit embodying the decoding hardware; and
an integrated circuit generation system configured to manufacture the decoding hardware according to the circuit layout description.

14. A method comprising:
receiving, at an input, mapping data for an instruction set and instruction data describing instructions in an instruction set in canonical form;
parsing the mapping data and instruction data using a grammar library;
generating, in a code and data generation engine, both encoding software and a hardware description of a decoder based on the parsed mapping data and instruction data, wherein the decoder comprises decoding hardware as set forth in claim 1; and
outputting the encoding software and the hardware description of a decoder.

15. The method according to claim 14, further comprising:
generating debugging data and documentation in human-readable form in the code and data generation engine and based on the parsed mapping data and instruction data; and
outputting the debugging data and documentation in human-readable form.

* * * * *